(12) United States Patent
Dayal et al.

(10) Patent No.: US 11,006,550 B2
(45) Date of Patent: May 11, 2021

(54) AIR FLOW DISTURBANCE DETERMINATION IN A COOLING SYSTEM

(71) Applicant: InvenSense, Inc., San Jose, CA (US)

(72) Inventors: Sankalp Dayal, Fremont, CA (US); Vamshi Gangumalla, Saratoga, CA (US); Zaryab Hamavand, San Jose, CA (US); Calin Miclaus, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 329 days.

(21) Appl. No.: 16/104,868

(22) Filed: Aug. 17, 2018

(65) Prior Publication Data

US 2019/0124795 A1   Apr. 25, 2019

Related U.S. Application Data

(60) Provisional application No. 62/576,425, filed on Oct. 24, 2017, provisional application No. 62/626,645, filed on Feb. 5, 2018.

(51) Int. Cl.
*H05K 7/20* (2006.01)
*G01F 1/34* (2006.01)

(52) U.S. Cl.
CPC .......... *H05K 7/20736* (2013.01); *G01F 1/34* (2013.01); *H05K 7/20727* (2013.01); *H05K 7/20836* (2013.01)

(58) Field of Classification Search
CPC .......... H05K 7/20836; H05K 7/20172; H05K 7/20209; H05K 7/20736; H05K 7/20727; H05K 7/20; G01F 1/34; G01F 1/88; G06F 1/20; G06F 1/206

USPC ........................................ 361/679.46–679.48
See application file for complete search history.

(56) References Cited

U.S. PATENT DOCUMENTS

| | | | |
|---|---|---|---|
| 6,747,872 B1* | 6/2004 | Patel | G06F 1/206 361/695 |
| 2003/0221821 A1 | 12/2003 | Patel et al. | |
| 2004/0020225 A1 | 2/2004 | Patel et al. | |
| 2004/0065097 A1 | 4/2004 | Bash et al. | |
| 2006/0168975 A1 | 8/2006 | Malone et al. | |
| 2008/0055850 A1* | 3/2008 | Carlson | H05K 7/20727 361/695 |
| 2016/0227675 A1* | 8/2016 | North | G06F 1/20 |
| 2017/0160775 A1* | 6/2017 | Sun | F24F 11/79 |
| 2017/0181328 A1* | 6/2017 | Shelnutt | H05K 7/20781 |

(Continued)

*Primary Examiner* — Mischita L Henson

(57) ABSTRACT

A circuit board cooling system includes a circuit board with a processor disposed thereon, a cooling unit operating according to an operating configuration to generate air flow to cool a portion of the circuit board, and a plurality of pressure sensors that are coupled with a sensor processing unit and configured to measure air pressure data at their respective locations. The pressure sensors include a first pressure sensor located between the processor and the cooling unit and a second pressure sensor located such that the processor is between the second pressure sensor and the cooling unit. Air pressure data measured by the plurality of pressure sensors is obtained by the sensor processing unit. The sensor processing unit compares the obtained air pressure data to reference air pressure data for the operating configuration and, based on the comparison, determines that a disturbance to the air flow exists.

19 Claims, 17 Drawing Sheets

(56) References Cited

U.S. PATENT DOCUMENTS

2019/0150316 A1\* 5/2019 Dayal .................. G06F 1/3296
361/679.48

\* cited by examiner

1100

```
┌─────────────────────────────────────────────────────────────┐
│  OBTAIN AIR PRESSURE DATA MEASURED BY A PLURALITY OF PRESSURE│
│                          SENSORS                             │
│                           1105                               │
└─────────────────────────────────────────────────────────────┘
                              │
                              ▼
┌─────────────────────────────────────────────────────────────┐
│   MONITOR AIR PRESSURE DATA MEASURED BY AND OBTAINED FROM A  │
│                 PLURALITY OF PRESSURE SENSORS                │
│                           1110                               │
└─────────────────────────────────────────────────────────────┘
                              │
                              ▼
┌─────────────────────────────────────────────────────────────┐
│  COMPARE THE OBTAINED AIR PRESSURE DATA TO REFERENCE AIR     │
│  PRESSURE DATA FOR THE OPERATING CONFIGURATION OF A COOLING UNIT│
│                           1115                               │
└─────────────────────────────────────────────────────────────┘
                              │
                              ▼
┌─────────────────────────────────────────────────────────────┐
│  BASED ON THE COMPARISON, DETERMINE THAT A DISTURBANCE TO THE AIR│
│                        FLOW EXISTS                           │
│                           1120                               │
└─────────────────────────────────────────────────────────────┘
```

DETERMINE A LOCATION OF THE DISTURBANCE TO THE AIR FLOW BASED ON THE COMPARISON
1145

1100 continued

DETERMINE A REGION OF THE CIRCUIT BOARD WHICH IS EXPERIENCING A DECREASE TO THE FLOW OF COOLING BASED ON THE COMPARISON
1150

1100 continued

GENERATE DISTURBANCE DATA RELATED TO THE DISTURBANCE TO THE AIR FLOW
1155

1100 continued

```
CLASSIFY THE DISTURBANCE TO THE AIR FLOW AS A ONE OF AN OBSTRUCTION AND
A MALFUNCTION OF THE COOLING SYSTEM BASED ON A DIFFERENCE BETWEEN THE
OBTAINED AIR PRESSURE DATA AND THE REFERENCE AIR PRESSURE DATA
1160
```

1100 continued

```
SEND A COMMUNICATION ABOUT THE DISTURBANCE TO THE AIR FLOW
1165
```

1100 continued

COORDINATE MODIFICATION OF THE OPERATING CONFIGURATION OF THE COOLING UNIT TO CORRECT FOR THE DISTURBANCE TO THE AIR FLOW
1170

1100 continued

INITIATE A SHUTDOWN TO PREVENT OVERHEATING THE CIRCUIT BOARD
1175

AIR FLOW DISTURBANCE DETERMINATION IN A COOLING SYSTEM

CROSS REFERENCE TO RELATED APPLICATIONS—PROVISIONAL

This application claims priority to and benefit of U.S. Provisional Patent Application No. 62/576,425 filed on Oct. 24, 2017 entitled "Air Flow Measurement in a Server Using Pressure Sensor" by Zaryab Hamavand and Calin Miclaus, which is assigned to the assignee of the present application. The disclosure of U.S. Provisional Patent Application No. 62/576,425 is hereby incorporated herein by reference in its entirety.

This application claims priority to and benefit of U.S. Provisional Patent Application No. 62/626,645 filed on Feb. 5, 2018 entitled "Device and Method for Optimizing Cooling by Measuring Air Flow and Temperature Using Pressure Sensors" by Sankalp Dayal and Vamshi Gangumalla, which is assigned to the assignee of the present application. The disclosure of U.S. Provisional Patent Application No. 62/626,645 is hereby incorporated herein by reference in its entirety.

BACKGROUND

Electronic equipment like servers, laptops, etc. typically requires cooling air to cool processing units (e.g., central processing units (CPUs), graphics processing units (GPUs)), memory (e.g., Random Access Memory (RAM)), and other electronic components. Absent sufficient cooling air, these electronic components could overheat and become damaged. In an item of electronic equipment, such as a server, cooling air is typically provided by a cooling unit which includes one or more fans. The fan(s) can consume 25% to 30% of total power consumed by the system in which the cooling unit operates. This power consumed by the cooling unit, in particular by its fan(s), in turn results in significant portion of the overall cost of operation of most any item of electronic equipment that includes a cooling unit. It follows that in a single piece of electronic equipment, such as a single server, cooling costs can comprise a large portion of the overall operating costs and maintaining adequate cooling air to cooled components is important. Similarly, for entities operating a large number of pieces of electronic equipment (such as servers in a server farm), the cost of cooling is significant and the importance of maintaining adequate cooling air to cooled electronic components is also significant.

BRIEF DESCRIPTION OF DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

FIGS. 11A-11J illustrate a flow diagram of an example method of air flow obstruction determination, in accordance with various embodiments.

DESCRIPTION OF EMBODIMENTS

Figure 1:
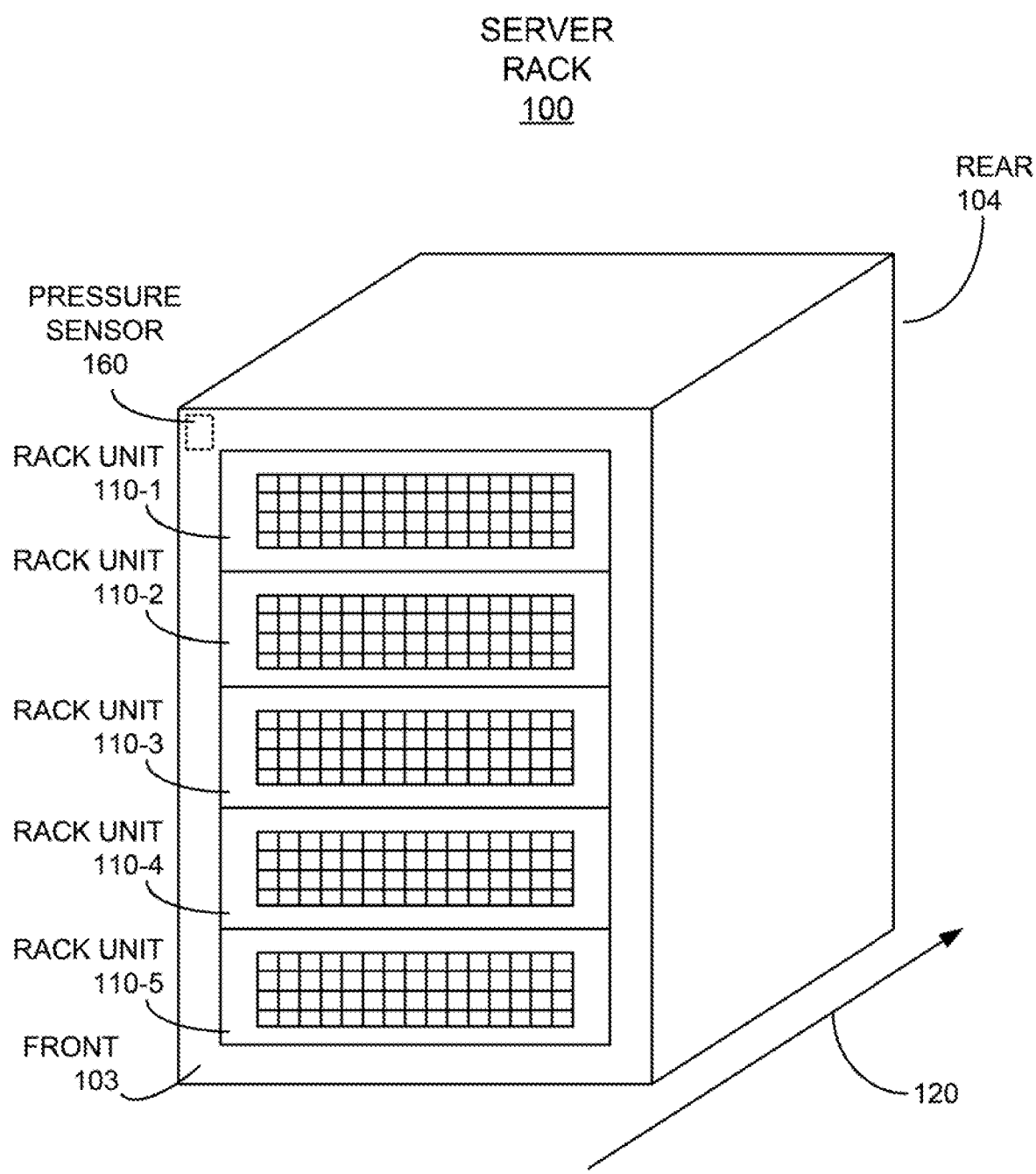
FIG. 1 illustrates an example server rack, in accordance with various embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of electrical or magnetic signals capable of being stored, transferred, combined, compared, and otherwise manipulated in an electronic device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "measuring," "obtaining," "comparing," "determining," "storing," "operating," "generating data," "classifying," "sending," "coordinating," "monitoring," "initiating," or the like, refer to the actions and processes of an electronic device such as: a sensor processing unit, a sensor processor, a host processor, a processor, a sensor, a memory, or the like, or a combination thereof. The electronic device manipulates and transforms data represented as physical (electronic and/or magnetic) quantities within the electronic device's registers and memories into other data similarly represented as physical quantities within the electronic device's memories or registers or other such information storage, transmission, processing, or display components.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example electronic device(s) such as servers described herein may include components other than those shown, including well-known components.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable data storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as one or more sensor processing units (SPUs), sensor processor(s), host processor(s) or core(s) thereof, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A processor may be a microprocessor, but in the alternative, the processor may be any conventional processor, controller, microcontroller, or state machine. A processor may also be implemented as a combination of computing devices, e.g., a combination of an SPU and a microprocessor, a plurality of microprocessors, one or more microprocessors in conjunction with an SPU core, or any other such configuration.

Overview of Discussion

Example embodiments described herein, improve the usability of electronic equipment such as computers, servers, and racks of electronic equipment. In some embodiments, improvements realized from the technology described herein may increase power efficiency of the cooling unit of an item of electronic equipment, provide an ability to detect a disturbance to cooling air in an item of electronic equipment, provide an ability to detect a location of a disturbance to cooling air in an item of electronic equipment, or a combination of the foregoing.

Cooling units in electronic equipment like servers may have multiple fans that can operate at multiple speeds. An "operating configuration" of a cooling unit is a configuration of which fans are operating and what speed(s) at which they are set to operate. In a cooling unit, selecting which set of fans to turn on and at what speeds they must be operated, results in different amounts of power consumed by the cooling unit during different operating configurations. An optimized operating configuration of fan(s), and their speeds, should maintain the right amount of airflow on the areas which are getting heated while keeping the power consumption as low as possible and/or maintaining the required temperature for the electronic equipment and one or more of its components. If more than required air is blown, it is waste of power and if air is blown in the areas where no cooling is required, it is also waste of power. A cooling unit may have one or more operating configurations. For example, a cooling unit in one server may have a first operating configuration that uses less power when a processor of the server is operated at 50% of its capacity and second operating configuration which creates more air flow and uses more power when the processor is operated at 100% of its capacity. Different operating configuration may include different required or desired (maximum) operating temperatures.

Electronic equipment like servers are highly configurable, however this highly regarded feature can also have drawbacks. Sometimes modifications, especially unplanned, poorly planned, or ad hoc modifications, can reduce power efficiency loss due to airflow bottlenecks (drag, obstructions, turbulences etc.). Put differently, a stock server configuration may not have the best cooling efficiency after customization/modification in the field. Further, most server designs do not include any air flow measuring sensor because (conventionally) these sensors are too expensive and too large for inclusion and use in any meaningful manner. Instead, servers have typically relied purely on temperature sensors to gauge cooling. Because of this, power efficiency and operating efficiency losses due to air flow obstructions, turbulences, and drag caused by components are not gauged and detected in real time.

As noted previously, the cost of power for fan use in the cooling of electronic equipment is a significant component of the cost of operating the electronic equipment. Hence optimizing or improving the efficiency of the usage of fans can readily reduce the amount of power consumed in operating an electronic equipment. Disturbance of air flow in an item of electronic equipment, such as a server, can cause overheating of components which can: destroy the components, shorten their lifespans, reduce their operating efficiency, and/or cause service outages. As such, determining the existence of an air flow disturbance and/or locating (within the electronic equipment) the general region of the disturbance in air flow can prevent overheating, identify conditions which may create overheating, and/or can facilitate troubleshooting and correction of air flow disturbances.

Pressure sensors are getting less expensive, more compact, and more sensitive, and can therefore be a substitute to air flow sensors. Because of their small size, these pressure sensors can be used in locations where a conventional air flow sensor would not physically fit. An example pressure sensor may be a pressure sensor from TDK/InvenSense from the ICP-101xx series, which is based on micro-electro-mechanical (MEM) capacitive technology. The techniques discussed here may be applied to, for example, servers, computers, laptops, or any other computing system, that uses airflow to cool down processors or other types of processing cores and/or electronic components. The air flow may be generated by a single fan, an array of fans, a plurality of fans, or any other method for generating airflow.

Herein, technology and techniques for measuring cooling air flow within electronic equipment are discussed. These measurements are made using air pressure sensors placed at known, fixed locations with respect to a piece of electronic equipment. In some embodiments, air pressure measurements from the air pressure sensors are obtained and then compared to stored measurements for a particular operating configuration of a cooling unit that supplies cooling air to the electronic equipment. Based on the comparison, it can be determined if there is a disturbance to the air flow in a particular region or location within the electronic equipment. For example, a disturbance to cooling air flow across a processor can be determined if the comparison reveals that cooling air flow is lower (beyond a predetermined threshold) than it should be for the current operating configuration of the cooling unit. Various responses can be triggered based on this determination, such as initiating an emergency shutdown of the electronic equipment, initiating/coordinating a change in the operating configuration of the cooling unit (e.g., increasing the speed of one or more fans) and/or the electronic equipment (e.g., throttling down a processor), generating data related to the disturbance of cooling air flow, and/or sending a communication (which may include the disturbance data) to a processor, system, or responsible entity about the noted disturbance to the flow of cooling air.

Architecture

FIG. 1 illustrates an example server rack 100, in accordance with various embodiments. As depicted, server rack 100 includes one or more installed rack units 110 (110-1, 110-2, 110-3, 110-4, and 110-5 are illustrated, though a greater or lesser number may be included). Server rack 100 has a front side 103 and a rear side 104 and cooling air flows through the rack units 110 in direction 120 from the front 103 to the rear of 104 of server rack 100. Rack 100 is not drawn to scale. Furthermore, although depicted as being uniform in vertical height, it should be appreciated that, within allowed standards, the vertical height of one or more of the rack units 110 may be different from that of others in a server rack 100. Arrow 120 shows the general direction of air flow from, through rack units 110, into the front 103 of rack units 110 and out the rear 104 (or upper rear) of server rack 100. Although referred to as "server rack" 100, it should be appreciated that server rack 100 is representative of any rack for mounting electronic equipment, which may include servers, other types of computers, storage devices, projectors, televisions, and/or any other type of electrical or electromechanical equipment which can be mounted in a rack or enclosure.

Without the installed rack units 110, server rack 100 would appear as a shell with a top, bottom, and sides, with front side 103 and rear side 104 framing a large through opening in the middle of server rack 100.

In some embodiments, server rack 100 further includes one or more pressure sensors 160 coupled with an external surface, such as on the front 103 of rack unit 110. When included, pressure sensor 160 operates to measure the ambient air pressure in which rack unit 110 exists and operates. Such ambient pressure measurements can be used as references for measurements by other pressure sensors (e.g., pressure sensors 360 illustrated in FIGS. 3A, 3B, 3C, and 4). Although only a single pressure sensor 160 is illustrated, additional pressure sensors 160 may be included and may be placed at other locations, such as on the sides or rear of rack 100 or at other locations that are remote from rack 100, but in the same environment (e.g., in the same room) in which rack 100 is located.

Figure 2:
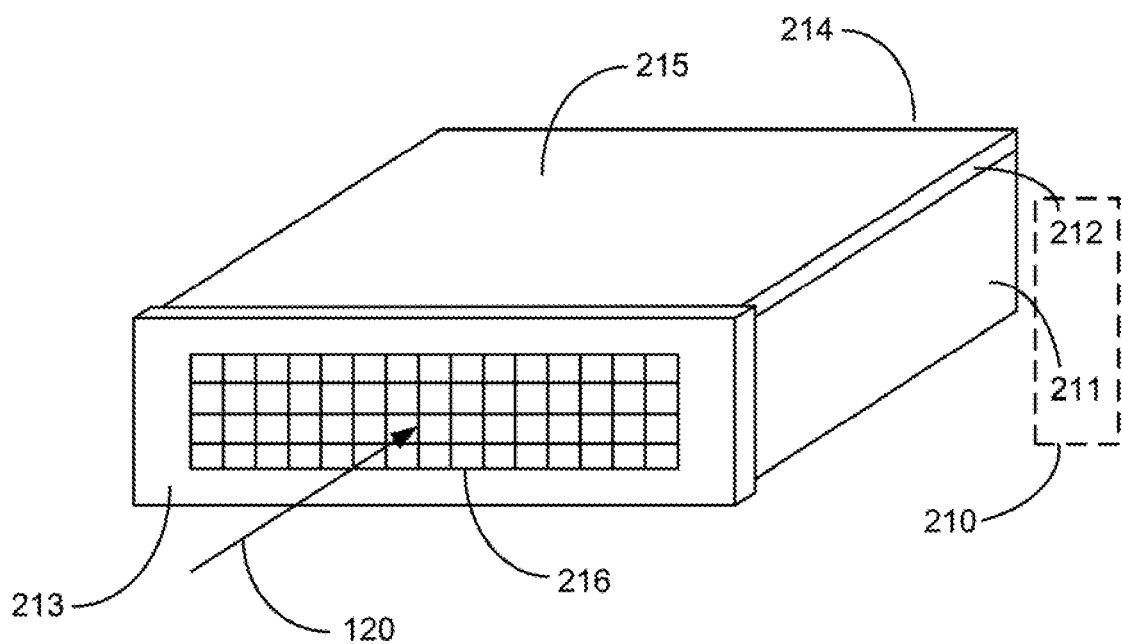
FIG. 2 illustrates an example rack unit usable with the server rack of FIG. 1, in accordance with various embodiments.

FIG. 2 illustrates an example rack unit 110 usable with the server rack 100 of FIG. 1, in accordance with various embodiments. Rack unit 110 can be used as any of the rack units 110-1 through 110-5 depicted in FIG. 1. Rack unit 110 comprises a housing 210 which houses electronic equipment. In the depicted embodiment, housing 210 has a body 211 and a cover 212 which couples to and forms a lid over the top of the body 211. Cover 212 has an external top side 215. In some embodiments, cover 212 may not be included in a rack unit 110 or other piece of electronic equipment. Rack unit 110 has a front 213 and a rear 214. A plurality of openings is configured into the front 213 of housing 210 to form an air intake 216. During operation, air flows in through air intake 216 and proceeds, generally, in direction 120 through rack unit 110 until it exits at the rear 214 of rack unit 110. When installed in a server rack 100, the air exiting the rear 214 of rack unit 110 typically exits the rear 104 (or upper rear) of the server rack 100.

Figure 3A:
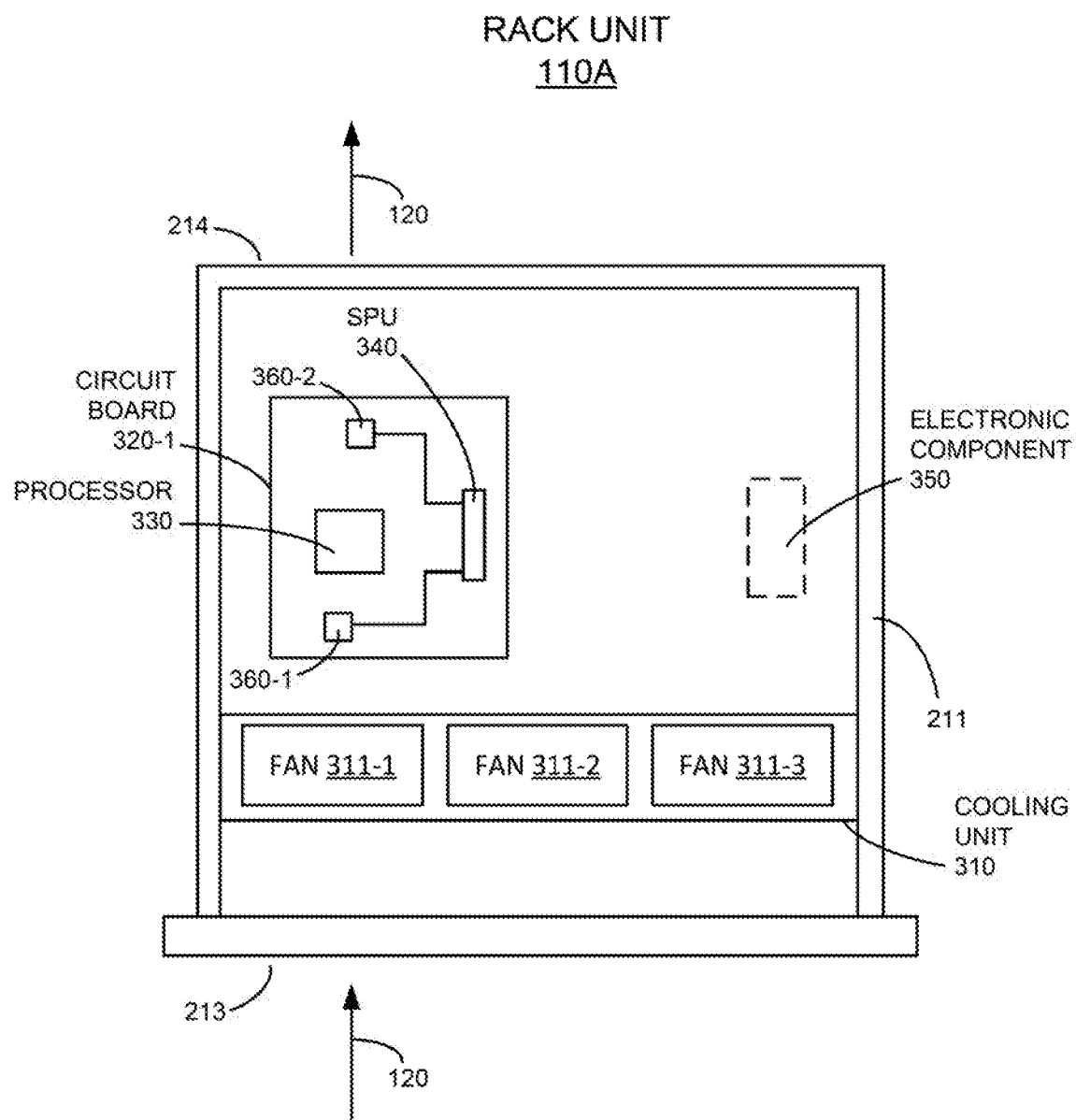
FIG. 3A illustrates a top view block diagram of the inside of the rack unit of FIG. 2, in accordance with various embodiments.

FIG. 3A illustrates a top view block diagram of the inside of a rack unit 110A which represents one configuration of rack unit 110 of FIG. 2, in accordance with various embodiments. The presented view is a top view of body 211 with cover 212 removed is removed or else not included in this embodiment. Rack unit 110 includes a cooling unit 310, a circuit board 320 (320-1 depicted), a processor 330, a sensor processing unit 340, and a plurality of pressure sensors 360. In some embodiments, rack unit 110 may include additional electronic component 350 and/or different configurations. Likewise, circuit board 320 may include additional components or different configurations.

Arrows 120 represent the general direction of air flow, from the front 213 to the rear 214 as it flows through rack unit 110A. It should be appreciated that, internally to rack unit 110A, air flow will deviate from direction 120 as it moves in, through, and around structures internal to rack unit 110A on its general flow from front 213 to rear 214 of rack unit 110A.

Cooling unit 310 is coupled with housing 210 and includes one or more fans 311. Three fans 311 (311-1, 311-2, and 311-3) are depicted, but a greater or lesser number of fans 311 may be included in other embodiments. Though not depicted, a cooling unit 310 may include a controller which controls the fans to operate according to a supplied/specified operating configuration. Fans 311 generates cooling air by pulling air through the front 213 of housing 210 and moving it out through the rear 214. As the air flow moves between front 213 and rear 214 it passes in, through, and/or around circuit board 320-1, processor 330, and/or electronic component 350. The flowing air absorbs and removes radiated heat and expels it out the rear 214 of rack unit 110, thus cooling the internal components (i.e., circuit board 320-1, processor 330, electronic component 350). Cooling unit 310 is configured, such as via its controller, to operate according to one or more operating configurations, and at any given time during operation is set to operate at one of its operating configurations.

An "operating configuration" of cooling unit 310 is a description/instruction for which fan(s) 311 in a cooling unit 310 should be operated and at what speed(s) they should be set to operate. In a cooling unit 310, variances between operating configurations include variations in which fans 311 in a cooling unit 310 are turned on and what speeds they are to be operated. These variations result in different amounts of power consumed by the cooling unit 310 in different operating configurations. For example, in a first operating configuration, fan 311-1 may be operated at 50 percent of its full speed while fan 311-2 is turned off (not operating) and fan 311-3 is turned off (not operating). In second operating configuration, fan 311-1 may be operated at full speed while fan 311-2 is operated at 50 percent of its full speed and fan 311-3 is operated at 50 percent of its full speed. In a third operating configuration, fans 311-1, 311-2, and 311-3 may all be operated at full speed. It should be appreciated that these are merely examples of operating configurations and that many other operating configurations are possible and anticipated.

Circuit board 320-1 is disposed within and coupled with housing 210 and provides a substrate on which one or more electronic components such as one or more processors 330 are disposed. In some embodiments, such as the depicted embodiment, a sensor processing unit 340 and/or one or more pressure sensors 360 may also be disposed upon circuit board 320-1. In some embodiments, all or a portion of a sensor processing unit 340 may be implemented as a portion of a larger processor 330 disposed on a circuit board.

Processor 330 can be one or more microprocessors, central processing units (CPUs), DSPs, general purpose microprocessors, processing cores, Application Specific Integrated Controllers (ASICs), Application Specific Instruction Set Processors (ASIPs), Field programmable gate arrays (FPGAs) or other processors which run software programs or applications. During operation processor 330 creates heat which is removed by cooling air that flows around processor 330 and/or its heatsink(s). The flow of cooling air is supplied by cooling unit 310.

Sensor processing unit (SPU) 340 is disposed within housing 210. SPU 340 is a specialized processor which uses less power than processor 330 and is configured to interface with and/or operate one or more sensors which sense environmental characteristics such as air pressure, temperature, direction, and the like. SPU 340 may be integrated into a single package such as an integrated circuit or small circuit board, which includes a processor, a memory, and in some instances one or more sensors.

A pressure sensor 360 (and also pressure sensor 160 of FIG. 1) operates to sense air pressure at its respective location and provide an electronic output which is calibrated to represent the sensed air pressure. Such pressure sensors are small and utilize very little power to operate. In some embodiments, such pressure sensors are micro-electro-mechanical system (MEMS) devices. For example, TDK/InvenSense pressure sensors from the ICP-101xx series, which is based on MEM capacitive technology, may be used as pressure sensor 160 and pressure sensors 360. In some embodiments, one or more pressure sensors 360 may be located within housing 210. In some embodiments, one or more pressure sensors 360 may be disposed on circuit board 320 and coupled, via conductive traces on the circuit board 320, to an SPU 340 (which may also be disposed on the circuit board). In some embodiments, each pressure sensor 160, 360 at a different location may be part of its own sensor processing unit 340, and each of these sensor processing units 340 may communicate with one another and/or with a controller for a cooling unit 310. In some embodiments, a pressure sensor 160 and/or 360 may also be configured to measure temperature as well as air pressure.

As depicted, pressure sensor 360-1 is disposed such that it is located between processor 330 and cooling unit 310. Pressure sensor 360-1 measures air pressure data at the position in which it is located. Pressure sensor 360-2 is disposed such that processor 330 is between the location of pressure sensor 360-2 and cooling unit 310. Pressure sensor 360-2 measures air pressure data at the position in which it is located. Based on their locations fore and aft of processor 330 in the flow of air from cooling unit 310, an air pressure measurement obtained from pressure sensor 360-2 can be subtracted from an air pressure measurement obtained from pressure sensor 360-1 to determine a pressure drop across processor 330 and the portion of circuit board 320 located between pressure sensors 360-1 and 360-2. In various embodiments, nominal pressure drops can be determined and stored for each operating configuration of cooling unit 310. Although not depicted as being directly in line with one another (in direction 120) in some embodiments, pressure sensors 360-1 and 360-2 may be so aligned. It should be appreciated that FIG. 3A (as well as FIGS. 3B, 3C, and 4) illustrate two-dimensional views, and that the depicted pressure sensors can be placed in three-dimensions. For example, pressure sensors 360 illustrated in FIG. 3A can be integrated into circuit board 320, mounted on circuit board 320 but not electrically integrated with other components on the circuit board, and/or mounted above circuit board 320.

Electronic component 350, when included, may comprise other electrical equipment such as a power supply, power conditioner, memory, disk drive, input/output circuitry, or the like, which operates in conjunction with processor 330 and which is disposed within housing 210. Electronic component 350 is also cooled by air flow which passes through housing 210.

Figure 3B:
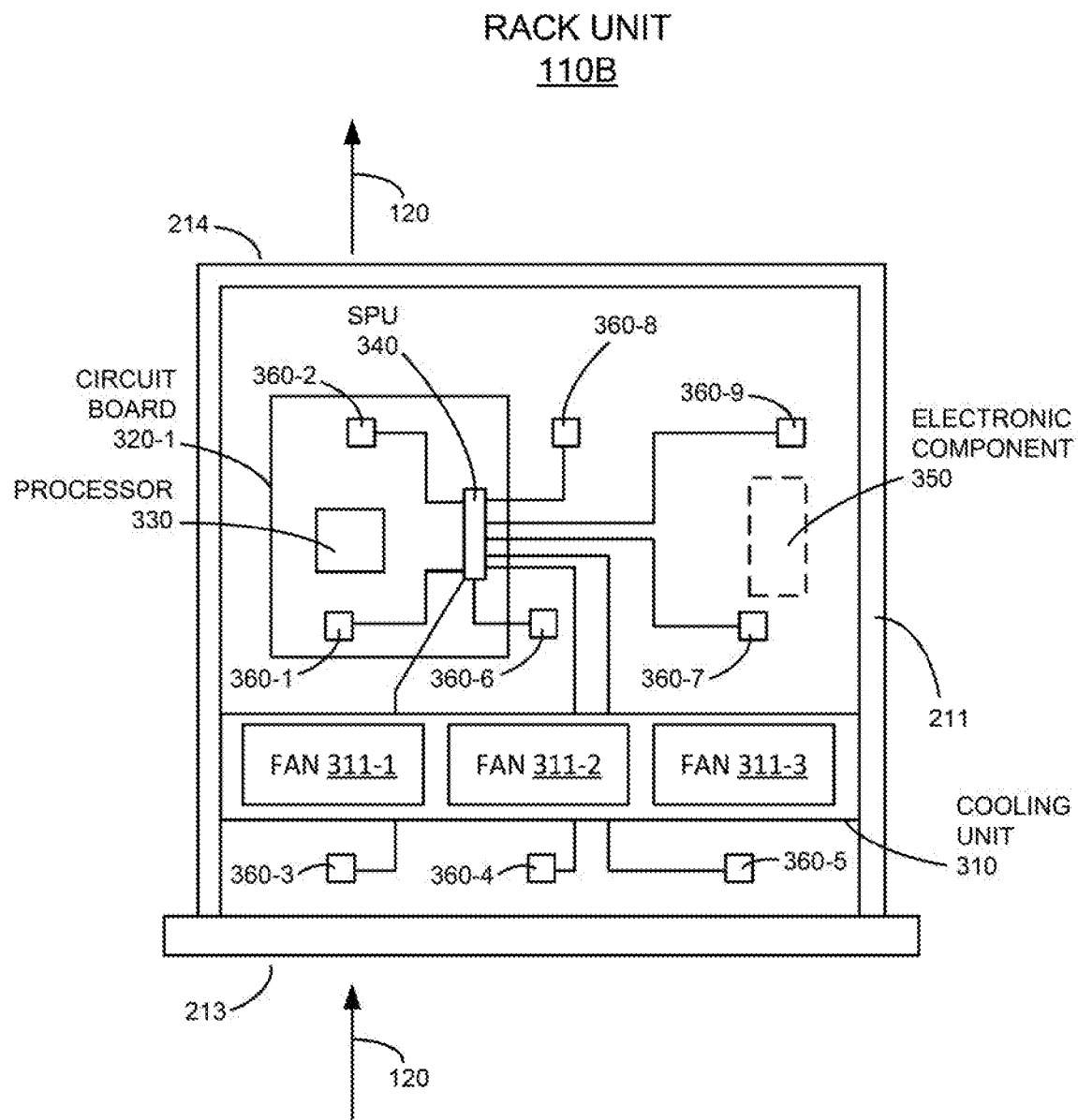
FIG. 3B illustrates a top view block diagram of the inside of the rack unit of FIG. 2, in accordance with various embodiments.

FIG. 3B illustrates a top view block diagram of the inside of a rack unit 110B which represents one configuration of rack unit 110 of FIG. 2, in accordance with various embodiments. The presented view is a top view of body 211 with cover 212 removed or else not included in this embodiment. FIG. 3B differs from FIG. 3A by including additional pressure sensors 360 (360-3 to 360-9) which form a larger two-dimensional arrangement of pressure sensors that can be used to measure air pressures in a plurality of other locations within housing 210 (e.g., to monitor cooling and air flow with respect to electronic component 350). The depicted two-dimensional layout or arrangement of pressure sensors 360-1 to 360-2 is an irregular pattern, in other embodiments the pattern may be a regular arrangement or array with uniform spacing between pressure sensors 360 and uniform alignment of pressures sensors 360.

Figure 3C:
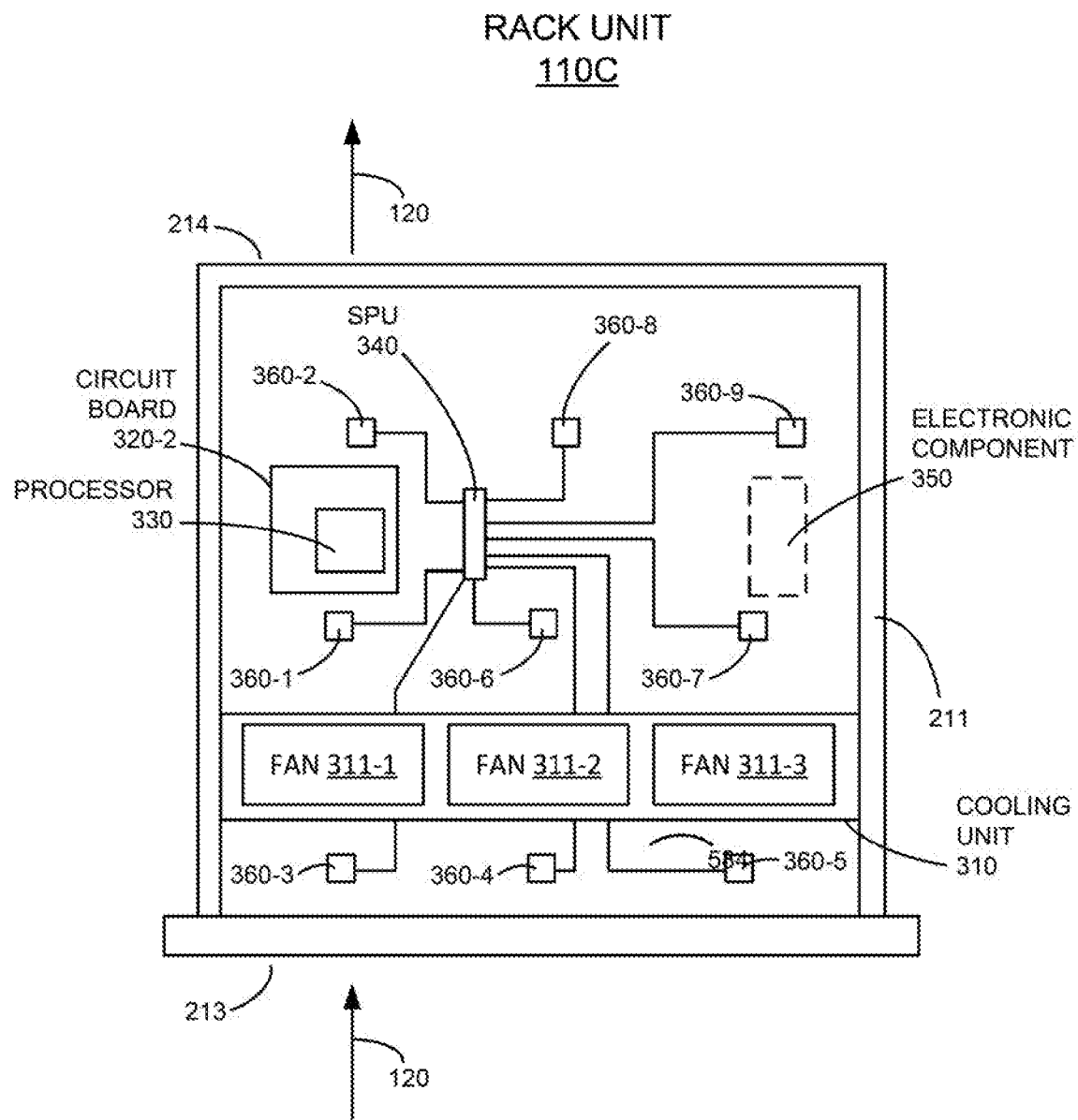
FIG. 3C illustrates a top view block diagram of the inside of the rack unit of FIG. 2, in accordance with various embodiments.

FIG. 3C illustrates a top view block diagram of the inside of a rack unit 110C which represents one configuration of rack unit 110 of FIG. 2, in accordance with various embodiments. The presented view is a top view of body 211 with cover 212 removed or else not included in this embodiment. FIG. 3C is similar to FIG. 3B except that neither sensor processing unit 340 nor any pressure sensors 360 are disposed as components of circuit board 320-3. It should be appreciated that in other embodiments, a circuit board 320 may have one or more pressure sensors 360 as components but not have an SPU 340 disposed as a component of the circuit board, or conversely may include an SPU 340 as a component but not have any pressure sensors disposed as components of the circuit board. In other embodiments, one or more pressure sensors 360 and/or an SPU 340 may be positioned on, above, or below a circuit board 320 without being integrated as components that are electrically coupled to the circuit board 320.

With reference to FIGS. 3A-3C, it should be appreciated that the layout, size, positioning, and number of components and circuit boards depicted are intended as non-limiting examples. That is, a rack unit 110 or other item of electronic equipment (e.g., a computer, projector, display, amplifier block, etc.) may include many different components, components of different sizes than shown, and components at locations that are different from the depictions. Likewise, a circuit board (whether in a rack unit or in another piece of electrical equipment being monitored for air flow disturbances may include many different components than those depicted, components of different sizes than shown, and components at locations that are different from the depictions.

Figure 4:
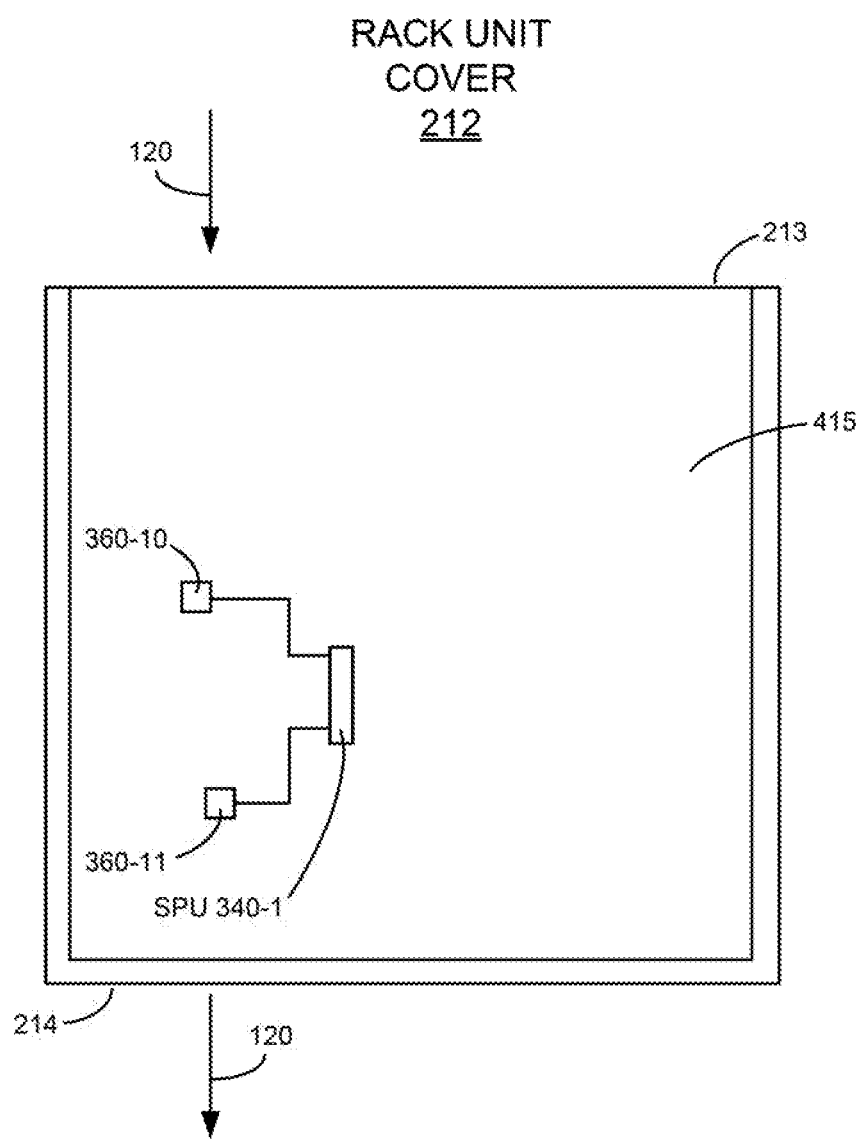
FIG. 4 illustrates a bottom view block diagram of components disposed upon the upper interior service of a rack unit cover for the rack unit of FIG. 2, in accordance with various embodiments.

FIG. 4 illustrates a bottom view block diagram of components disposed upon the upper interior surface 415 of a cover 212 for the housing 210 of rack unit 110 of FIG. 2, in accordance with various embodiments. In some embodiments, pressure sensors 360 (e.g., 360-10, 360-11, and the like) may be disposed upon upper interior surface 415. These pressure sensors 360 are coupled with a sensor processing unit 340, which may be the sensor processing unit 340 of FIG. 3A, FIG. 3B, or FIG. 3C or a separate sensor processing unit 340-1 disposed upon upper interior surface 415 or elsewhere. In some embodiments, pressure sensors 360 may only be disposed upon the upper interior surface 415 of cover 212 with none being disposed elsewhere within housing 210. In other embodiments, pressure sensors 360 may only be disposed within body 211 of housing 210 with no pressure sensors disposed upon the upper interior surface 415 of cover 212. In some embodiments, pressure sensors 360 may be disposed upon both the upper interior surface 415 of cover 212 and elsewhere within housing 210.

As depicted, pressure sensor 360-10 is disposed such that it is located between processor 330 and cooling unit 310 (when cover 212 is installed atop body 211 of housing 210). Pressure sensor 360-10 measures air pressure data at the position in which it is located. Pressure sensor 360-11 is disposed such that processor 330 is between the location of pressure sensor 360-11 and cooling unit 310 (when cover 212 is installed atop body 211 of housing 210). Pressure sensor 360-11 measures air pressure data at the position in which it is located. Based on their locations fore and aft of processor 330 in the flow of air from cooling unit 310, an air pressure measurement obtained from pressure sensor 360-11 can be subtracted from an air pressure measurement obtained from pressure sensor 360-10 to determine a pressure change across processor 330 and the portion of circuit board 320 located between pressure sensors 360-10 and 360-11. In various embodiments, nominal pressure changes can be determined and stored as reference for each operating configuration of cooling unit 310. Although not depicted as being directly in line with one another (in direction 120), in some embodiments, pressure sensors 360-10 and 360-11 may be so aligned.

Figure 5:
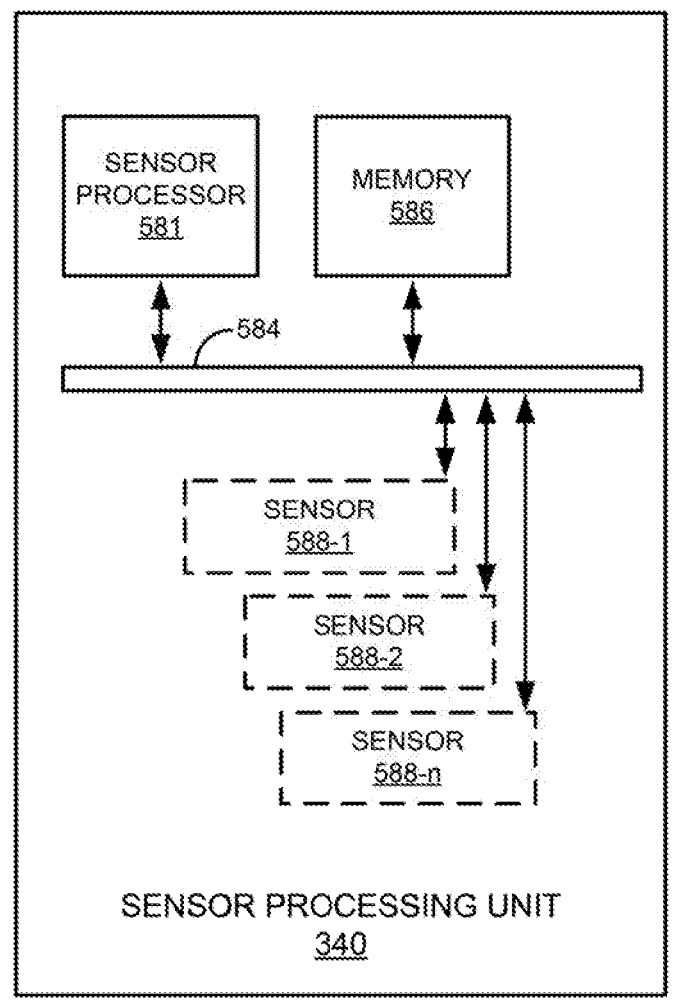
FIG. 5 illustrates a block diagram of an example sensor processing unit, in accordance with various embodiments.

FIG. 5 illustrates a block diagram of an example sensor processing unit (SPU) 340, in accordance with various embodiments. SPU 340 is an integrated sensor assembly which includes a sensor processor 581, a memory, and a bus 584. In some embodiments, SPU 340 also integrates at least one or more sensors 588 (588-1, 588-2, . . . 588-$n$) in its package. Bus 584 facilitates communication between these and other components of sensor processing unit 340 and may provide a communication path for other sensors (e.g., air pressure sensors 160, 360) which are coupled with and operated by sensor processing unit 340 but are not within the integrated package of SPU 340. In some embodiments, some or all the components illustrated in sensor processing unit 340 may be embodied in a single package or even on a single integrated circuit. For example, the sensor processor 581, bus 584, memory 586, and at least one sensor 588 (which may be a pressure sensor, temperature sensor, motion sensor) may be integrated with one another into a single package or even in a single integrated circuit. It should be appreciated that sensor processing unit 340 may be manufactured as a stand-alone unit (e.g., an integrated circuit) that may exist separately from a larger electronic device or circuit board. In other embodiments, SPU 340 may be manufactured such that it is disposed upon a larger circuit board (e.g., circuit board 320) which includes other components such as a processor 330 which may be a host processor in the environment where SPU 340 is operated.

Sensor processor 581 can be one or more microprocessors, CPUs, DSPs, general purpose microprocessors, ASICs, ASIPs, FPGAs or other processors which run software programs, which may be stored in memory 586, associated with the functions of sensor processing unit 340. In some embodiments, sensor processor 581 and/or SPU 340 may communicate with a cooling unit 310 to set and/or adjust the operating configuration of the cooling unit. This may include sensor processor 581 communicating with a controller of the cooling unit 310 or with any control mechanism for cooling unit 310. In some embodiments, the communications may be carried out by a communications module or routine (not shown) under the direction of sensor processor 581. In some embodiments, sensor processor 518 carries out or directs communications with and/or messages or reports to an external entity (which may be a human or a machine) such as a controller, supervisor, or manager of systems.

Bus 584 may be any suitable bus or interface to include, without limitation, a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. In the embodiment shown, sensor processor 581, memory 586, sensor(s) 588 (if any), and other components of sensor processing unit 340 may be communicatively coupled through bus 584 in order to exchange data. Bus 584 may be connected to an external bus, such as a bus on the circuit board being monitored, or directly to the overall host controller for a system. In some instances, some or all communication between components may also be wireless, reducing or eliminating the need for bus 584 and/or external connections to other busses.

Memory 586 can be any suitable type of memory, including but not limited to electronic memory (e.g., read only memory (ROM), random access memory, or other electronic memory). Memory 586 may store algorithms or routines or other instructions for processing data received from one or more sensors 588, 160 and/or 360, as well as the received data either in its raw form or after some processing. Such algorithms and routines may be implemented by sensor processor 581 and/or by logic or processing capabilities included in sensor 588.

Sensor processing unit 340 may include at least one sensor 588 but may include two or more sensors 588 of the same or different types. A sensor 588 may comprise, without limitation: a temperature sensor, an atmospheric pressure sensor, an infrared sensor, an ultrasonic sensor, a radio frequency sensor, a navigation satellite system sensor (such as a global positioning system receiver), an acoustic sensor (e.g., a microphone), an image sensor, an inertial or motion sensor (e.g., a gyroscope, accelerometer, or magnetometer) for measuring the orientation or motion of the sensor in space, or other type of sensor for measuring other physical or environmental quantities. In one example, sensor 588-1 may comprise a temperature sensor, sensor 588-2 may comprise a pressure sensor, and sensor 588-*n* may comprise an acoustic sensor. The acoustic sensor may be used to gauge sound levels associated with various operating configurations of cooling unit 310 during nominal operation, so that differences can be noted (such as if a fan 311 is malfunctioning). In other embodiments, a motions sensor may be included as one of the sensors 588, to provide indications that a server, rack unit, or piece of monitored electronic equipment has been moved. Movement may occur during installation, removal, reinstallation, modification, or the like—all instances where an disturbance to air flow may be introduced into a piece of electronic equipment. It should be appreciated that other types of sensors may be utilized in various other combinations.

In some embodiments, one or more sensors 588 may be implemented using a micro-electro-mechanical system (MEMS) that is integrated with sensor processor 581 and one or more other components of SPU 340 in a single chip or package.

Although depicted as being included within sensor processing unit 340, one, some, or all sensors 588 may be disposed externally to sensor processing unit 340 in various embodiments. In such a case, the sensor(s) 588 may be referred to as external sensors and may be connected to bus 584 to communicate with sensor processor 581 and/or sensor processing unit 340.

Operation of Architecture

To measure the air flow over the processor(s) and/or other electronic components that need cooling, an item of electronic equipment, such as a server, needs to be configured with one or more pressure systems. The amount of pressure sensors depends on the analysis that is desired/required, and the spatial resolution desired/required. FIG. 3A-3C show example architectures, where pressure sensors 360 are mounted inside the housing 210 of a rack unit 110 which, in some embodiments. The pressure sensors may be mounted strategically in/around various components of the server. In some embodiments, one or more pressure sensors 160, may be mounted outside of the housing 210 to measure ambient pressure and to be used as a reference pressure(s) in differential pressure determinations. Some or all these pressure sensors 160 and 360 may be capable of measuring air pressure as well as measuring temperature at the same time.

FIGS. 3B and 3C show pressure sensors 360 place before (pressure sensors 360-3, 360-4, and 360-5) and after (pressure sensors 360-1, 360-6, and 360-7) the fans 311. Pressures measured by these pressure sensors may be compared to the ambient reference pressure (measured by a pressure sensor 160). These pressure sensors fore and aft the fans 311 may be used to determine the efficiency of the fans in general or of one or more particular operating configurations of the fans 311 in cooling unit 310. The efficiency of the fans in terms of measured pressure fore and aft and/or pressure differentials between fore and aft pressure sensors may also be compared to one or more of: power consumption of the fan(s) 311 in one or more operating configurations of cooling unit 310; temperature(s) measured within housing 210; and operating load of the processing core(s) of processor 330.

The differential pressure across the fans may be used to determine the efficiency of the fans and/or motors of the fans. In addition, the differential pressure may be used to monitor closing and/or obstructions of the air intake or the air outlet. For example, the differential pressure between e.g., pressure sensor 360-3 and 360-1 may be used to monitor fan 311-1. Alternatively, a first differential pressure between pressure sensor 360-3 and the reference pressures sensor (e.g., pressure sensor 160) may be compared to a second differential pressure between pressure sensor 360-1 and the reference pressure sensor. If fan 311-1 is operating normally and efficiently, the first differential pressure and the second differential pressure should have comparable values. If the first differential pressure and the second differential pressure differ significantly, this can signal clogging or an obstruction at the air intake or air outlet. For example, if the first differential pressure is much larger than the second differential pressure (e.g., by at least a predetermined threshold amount), this indicates an obstruction or clogging at the air inlet of the fan. On the other hand, if the first differential pressure is much smaller than the second differential pressure (e.g., by at least a predetermined threshold amount), this indicates an obstruction or clogging at the air outlet of the fan. If the system has a plurality of fans, then comparing data for the different fans may be used to locate to position of the obstruction. Furthermore, if a problem is detected at one of the fans, a testing routing may be initiate at the other fans to verify if the other fans also have problems, and if an intervention is required.

The air intake and air outlet may also comprise air filters. The air filter may get clogged over time or may be obstructed for other reasons. Any obstruction or clogging may prevent correct cooling of the system. The clogging of the air filter may be monitored using differential pressure sensing. An air filter may have a first pressure sensor that measures the air pressure on the air intake side of the filter and a second pressure sensor that measure the air pressure on the air outlet side of the air filter. By comparing the pressure from the first and second pressure sensors, the state of the filter can be determined, and the amount of clogging or obstruction may be estimated. Similarly, changes and rates of change between these two measurements can be monitored over time and filter clogging can be determined based on either or both of these changes. Alternatively, a first differential pressure between the pressure sensor on the intake side and the reference pressure sensor (e.g., sensor 160) may be compared to a second differential pressure between the pressure sensor on the outlet side and the reference pressure sensor. Comparing these differential pressures to each other or to thresholds may be used to estimate the state of the filter. If the filter is not clogged and is in a normal/clean state, the first differential pressure should be slightly larger than the second differential pressure. This slight difference is due to the fact that even when the filter is clean, there is a slight pressure loss over the filter. When the filter becomes clogged or there is any other sort of obstruction, the first differential pressure become larger than the second differential pressure. The difference between the first and second differential pressure may be used to quantify the state of the filter and the level of clogging or obstruction. In one example embodiment, the state of the filter may indicate the part of the filter that is clogged and may be expressed as a clogging or obstruction percentage. The relation between the difference in the first and second differential pressure and the clogging percentage may be a linear, exponential, logarithmic, or any other non-linear or empirically determined scale. The ratio of first and second differential pressure may also be compared to one or more thresholds to classify the filter state. For example, in some embodiments, when only one threshold is used, the filter can be either clean or clogged. If more thresholds are used, a more gradual clogging scale can be determined (e.g., filter life remaining, percent clogged, etc.). In response to determination of an obstruction, clog, blockage, or filter that is dirty/clogged beyond a predetermined acceptable standard, a message or other communication may be sent by sensor processing unit 340 to one or more responsible entities (human and/or computer) and/or an indicator may be set to provide an electronic, aural, and/or visual indication that the filter needs to be changed or serviced.

FIGS. 3A, 3B, 3C, and 4 also depict embodiments where pressure sensors 360 are located on fore and aft sides of processor 330 (in the general air flow direction 120) to determine the air flow via air pressure and/or changes in air pressure. The pressure sensor may be mounted only on the fore and aft sides reflecting the direction 120 of main air flow, or on all four sides. Other areas on circuit board 320 or in other location of housing 210 may be occupied by memory or other electronic components. Pressure sensors 360 may be placed in proximity to these other areas to measure and/or assist in regulating the air flow in those areas. For example, with respect to these other areas (which may not need as much cooling as processor 330) measurements of air pressure may be made to make sure not too much air flow is generated there since it may not be needed as it would thus be a waste of power and cost to overcool these other areas. One or more pressure sensors 360 (360-2, 360-8, and 360-9) may also be place near the rear 214 to determine the general air flow. Any sensor combination may be used to determine airflow, via differential pressure, between those pressure sensors 360. The pressure sensors 360 may be placed in a two-dimensional arrangement which may be a uniform array or a non-uniform arrangement. In the two-dimensional arrangement, the spacing between the pressure sensors 360 may be related to the areas where it is desired to measure pressure and/or the resolution of the required measurement information. The spacing is directly related to the overall costs of the pressure sensors 360 as tighter spacing requires more pressure sensors 360, and a trade may be struck in some embodiments to balance or optimize the costs of the pressure sensors 360 and the savings gained in reduced power costs realized by only providing cooling air flow which needed as evidenced by measurements from the pressure sensors 360. The pressure sensors 360 may also be place before and after of the areas of interest (e.g., processor(s), circuit boards, memory, disk drives, etc.) in the main direction 120 of the air flow through housing 210. The pressure sensors 360 may be mounted on the main circuit board (e.g., circuit board 320) on which the processor 330 and memory are also placed, or the pressure sensors 360 may be mounted independently (e.g., in the cover 212 or body 211 of the housing 210 in which the circuit board is disposed). The processing of pressure data may be performed by the main processor 330 (that needs to be cooled), or a dedicated (sensor) processor (e.g., sensor processor 581) which is associated with one or more of the pressure sensors 360 may be used.

The pressure measurements obtained from pressure sensors 360 in FIGS. 3A, 3B, 3C, and 4 give a distribution of volume of air flowing in different areas of the housing 210 of a rack unit 110 for a given operating configuration cooling unit 310. Typically, operating configurations are chosen which increase the speed of fans as load on processor 330 increases so that air flow increases (with increasing load) around the area where processor 330 is positioned. This is expected and desirable. In situations, where all fans in cooling unit 310 are operated at the same speed, air flow also increases in other areas far away from processor 330 (such as near pressure sensor 360-7 and 360-9 which, because far from processor 330 are not likely to need more cooling simply due to an increase in the load on processor 330. Hence, blowing air (or more air) in these areas can be a waste of power. Because of this, in some embodiments of a rack unit 110 there are be better configurations than running all fans in a cooling unit 310 at the same speed when concentrated and/or increased air flow in the region of the processor 330 may be all that is required for adequate cooling of all electronic components within the rack unit 110.

In some embodiments, empirically determined pressure difference measurements between various pressure sensors 360 disposed in a rack unit 110 are used to estimate operating configurations fans within a cooling unit 310 that allow the right amount of air flow at the processor area but minimum or reduce waste air flow in areas where cooling is not required and/or where less cooling is required. These configurations may vary based upon load on the processor 330, but in general result in lower power consumption versus simply operating all fans at 100 percent speed or versus operating all fans at the same speed. This is because, in these configurations, some of the fans are may not be operated at the same speed or at all. Generally, it has been observed from measuring pressure differentials in the manner described that fans farther away from processor 330 (e.g., fan 311-3) even when operated at lower speed than ones near (e.g., fans 311-1 and 311-2) do not affect the cooling at the processor. Hence this allows an increased level of optimization of power consumption by operating fans closer to processor 330 at a first speed and operating fans 311 farther away from the processor 330 at a lower speed than this first speed (or not at all).

Air Flow Fundamentals

As processor load increases, heating increases on the processing units (e.g., processor 330). Hence the amount of energy (Q) to be dissipated increases. From a cooling perspective this means more air flow is required over the processing units to achieve cooling.

The relationship that determines the required volume of air needed to cool a processing unit can be given by Equation 1.

$$G = Q \div (\rho C_P \times T) \qquad \text{Equation 1}$$

In Equation 1, G is the volume of air, T is temp difference between ambient air and processing unit and ρ represents the density of air (which is typically used as a constant in such equations but can be varied based on altitude).

The relationship of volume of air and fan speed is given by Equation 2, wherein N is the speed of the fan and D is the diameter of the fan.

$$G = K_q N D^3 \qquad \text{Equation 2}$$

The volume of air flowing creates a pressure difference given by Equation 3.

$$P = K_P \rho N^2 D^2 \qquad \text{Equation 3}$$

This pressure difference can be measured by subtracting ambient pressure from the pressure measured at a given point. If this difference is positive, it means more air is coming at that location. If the pressure difference is negative, it means more air is going away from that point. It follows then that the pressure will be negative at the intake of fans and positive at the exhaust. Differential pressure measurement is one part of determining air flow and means, typically, that a pressure measurement system as described herein comprises at least two pressure sensors, and air flow is determined based on their pressure difference. Changes in air flow can be noted when the pressure difference changes. However, with a single pressure sensor, an obtained pressure measurement may be compared to a stored pressure measurement value for that pressure sensor to achieve a similar result for a single location. Likewise, pressure differences between pressure sensors may be compared to stored values. The stored values may be considered normal operating values and variance beyond some threshold amount from such stored values is indicative of some sort of disturbance to air flow. The stored values may be predetermined and preset (such as at a factory), empirically determined such as an averaged value over time or a value acquired during normal operation, or some combination. When pressure is discussed herein, it may refer to an absolute pressure at that point, relative pressure compared to a stored value, or a differential pressure between two pressure sensors.

Air Flow Obstruction Detection and Determination

Pressure measurements obtained from pressure sensors 360 can be utilized to determine if there is any obstruction that has been introduced to a rack unit 110 that is changing the airflow from an expected/normal air flow for an operating configuration of the cooling unit 310 of the rack unit 110. One example embodiment of an obstruction detection algorithm is represented by the flow diagram 600 of FIG. 6.

In some embodiments, if for any configuration, pressure values obtained from all pressure sensors, not just those near a processor 330, are not as expected, then the algorithm triggers that there is an obstruction to air flow. In other embodiments, the algorithm may trigger that there is an obstruction when only some pressure values, but not all pressure values, are not as expected. This may be the case when a local obstruction affects only some of the pressure sensors because air flow is disturbed only locally but not globally.

Consider P_obst as airflow after introduction of obstruction and P_reference as a stored, reference configuration 606 of ideal, desired, or expected air flow for an operating configuration of a cooling unit 310. The reference value represents the pressure (difference) value corresponding to a desired airflow as it is intended to be by design. For example, the reference value may be calculated or may be determined empirically (in the factory and/or over time during operation). This stored configuration may be as stored in a memory (which may be memory 586 of SPU 340) such as in the form a look up table.

If any value i in a set for measured pressures from a set of pressure sensors |P_obst–P_reference| satisfies |P_obst–P_reference[i]|>thresh_obst then obstruction is detected, where "thresh_obstr" is a threshold value that must be exceeded for it to be determined that an obstruction to normal air flow for the operating configuration has been detected. The threshold value may be an absolute value, or a relative value, and may dependent e.g., on the processor load or on the fan speed or air flow. A detection of a possible obstruction for a single pressure sensor, may activate the obstruction test for more, or all, pressure sensors.

Because servers may be configurable and other modules may be inserted in a rack unit 110 later during the lifetime of the server which is also disposed in the rack unit 110, the airflow may change compared to an airflow detected at the initial (reference) calibration and selection of the fan configuration. Therefore, when pressure values are compared to pressure values stored from the initial use, i.e., before a modification, any differences may indicate disturbances to the air flow. If one or more pressure (difference) reading differ from the current reading more than a threshold, there is a high probability of an obstruction which may be due to the modification or to other reasons. More generally, comparison of pressure (difference) readings from identical configurations at different times may be used to detect any problems, such as new obstructions or fans malfunctioning. With a two-dimensional arrangement of pressure sensors 360, the pressure sensors which exhibit the largest changes are indicative of: 1) the areas most affected by a disturbance to air flow; and 2) a likely two-dimension area within a rack unit 110 in which the obstruction is located (if the disturbance is not related to a fan malfunction). With enough resolution (i.e., enough pressure sensors) the two-dimensional location of an obstruction or impacted component(s) may be narrowed substantially. For example, with pressure sensors fore and aft a processor in the flow of cooling air it may be determined if the processor and its area of a circuit board is experiencing a disturbance (i.e., decrease) to air flow from what is expected for an operating configuration of a cooling unit 310. More in general, through the use of the pressure sensors and the methods and techniques discussed herein, any obstruction may be detected, and the obstruction may be located relative to the circuit board, or enclosure in which the circuit board is disposed. The accuracy of the location depends on the number and location of the pressure sensors. The obstruction may also be classified and/or quantified based on the change in pressure readings, and the number of pressure sensors affected. The number of pressure sensors thus depends on the required accuracy and the allowed costs, which could be weighed compared to the costs of malfunctioning and intervention. For example, when it is desirable to avoid down time for item of electronic equipment, a more accurate location can assist a technician in quickly locating an obstruction or other problem.

Detection of an obstruction or other disturbance to air flow may trigger a new calibration routine which runs fans through a series of possible configurations in an attempt to achieve the same airflow as before, but now with a different operating configuration that compensates for the disturbance (e.g., obstruction, modified configuration, and/or fan malfunction). If the original air flow can be re-achieved with a different operating configuration of cooling unit 310, then a processor such as SPU 340 may coordinate the change in operating configuration to correct for the disturbance to air flow that has been determined to exist. For example, sensor processor 581 may coordinate with a controller for cooling unit 310 or with controllers for one or more of the fans in cooling unit 310. The coordinating may involve suspending the current operating configuration and setting all the fans to a different stored operating configuration, iteratively adjusting the fans 311 in a cooling unit 310 to determine an acceptable new operating configuration, and/or defaulting to a safety operating configuration such as setting all fans 311 in a cooling unit 310 to operate at maximum speed. If no operating configuration can be found to overcome the disturbance to the air flow, the occurrence of a disturbance in air flow may be communicated to a system supervisor, manager, or other person or entity. In some embodiments, other remedial action such as an emergency shut down, throttle down (i.e., load limiting), or idling of one or more components may be initiated in response to being unable to coordinate an operating condition that adequately compensates for the disturbance. For example, sensor processor 518 may calculate or look up (from information stored in memory 586) the maximum load that is supportable by the detected cooling air flow and then send an instruction to processor 330 or a responsible entity to initiate adjustments which will limit the load of processor 330 or other components to this maximum.

In some embodiments, the occurrence of a disturbance to air flow may be automatically electronically reported to a responsible entity (supervisor, computer monitoring system, etc.) before or without regard to any other action. The report may include disturbance information which may comprise one or more of: data indicating that a disturbance to the air flow exists; data indicating a location of the disturbance to the air flow; and data classifying the disturbance to the air flow. The classification may be one of: there is an obstruction; or there is malfunction (such as in a fan or in another component).

Because temperatures tend to rise slowly, an obstruction or other air flow disturbance may be detected before temperature sensors (if any) in a rack unit 110 would indicate that there is a problem with cooling. Further, an alert due to rising temperature gives no information about the detection of an obstruction or of the region affected by the obstruction or the potential location within a housing of a server where the obstruction may be located.

Additional Architecture

Figure 6:
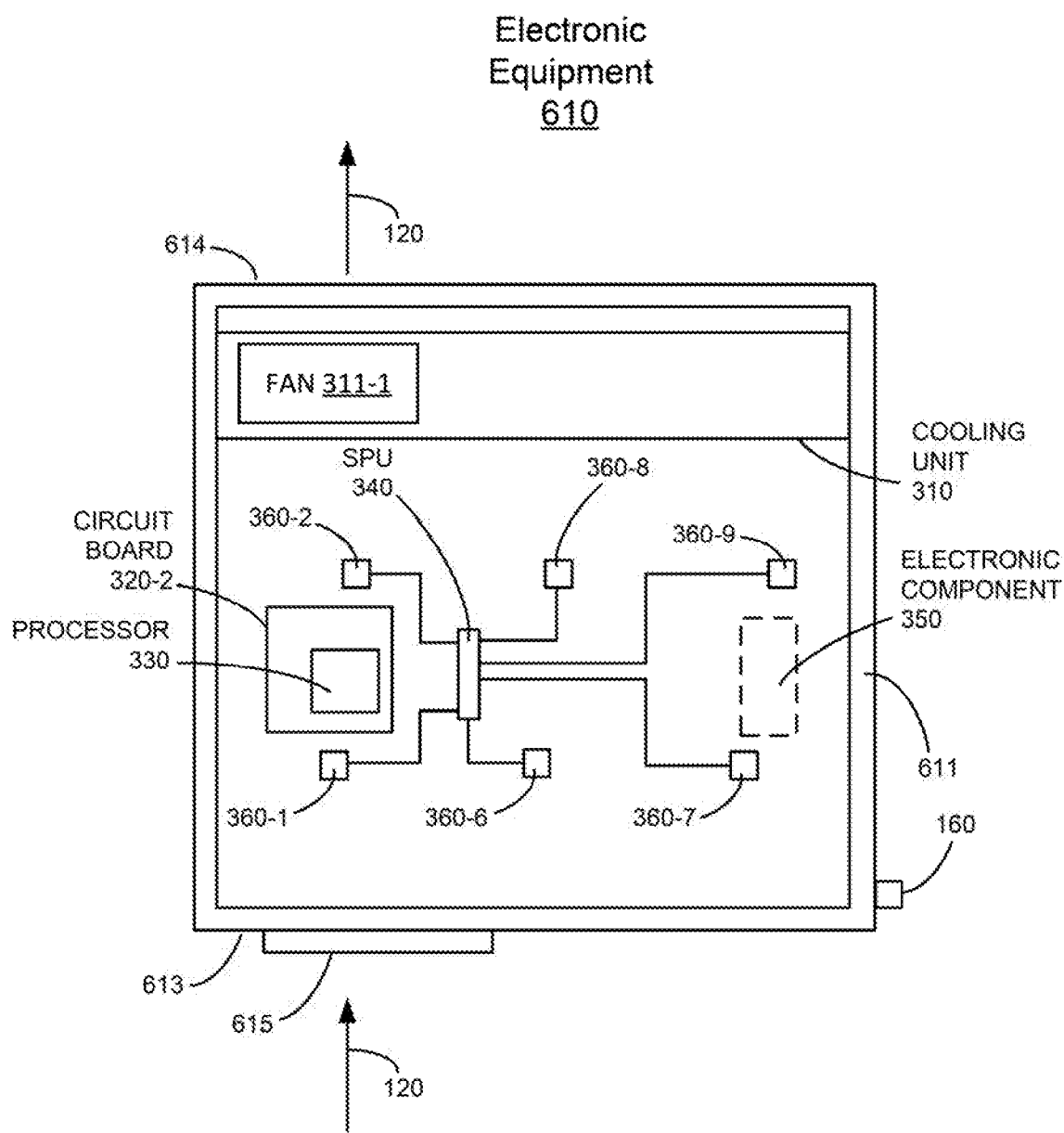
FIG. 6 illustrates a top view block diagram of the inside of an item of electronic equipment, in accordance with various embodiments.

FIG. 6 illustrates a top view block diagram of the inside of an item of electronic equipment 610 (e.g., a rack unit, server computer, laptop computer, notebook computer, tower computer, projector, display, etc.), in accordance with various embodiments. The presented view is a top view of the enclosure body 611. A cover to body 611, if one exists, has removed to illustrate the block diagram of components. Enclosure body 611 has a front 613 and a rear 614 and air flow is pulled generally in direction 120 through enclosure body 611. That is, air is pulled in through one or more air intakes 615 at front 613, and then exits at rear 614. The air is pulled through enclosure body 611 and across components therein by a cooling unit 310 disposed near the rear 614. Cooling unit 310 is depicted with only one fan, 311-1, but in other embodiments, more fans 311 may be included. Pulling of cooling air flow, illustrated in FIG. 6, differs from FIGS. 3A-3C where air flow was pushed air across the components. FIG. 6 is similar to FIG. 3C in that neither sensor processing unit 340 nor any pressure sensors 360 are disposed as components of circuit board 320-3, however, in other embodiments they may be. Although not depicted, processor 330 may be coupled with a heatsink. Pressure sensor 360-1 is disposed in front of processor 330 and/or circuit board 320-2 (with respect to air flow) and measures the pressure of air flow prior to the air flow interacting with processor 330 and/or circuit board 320-2. Pressure sensor 360-2 is disposed aft of processor 330 and/or circuit board 320-2 (with respect to air flow) and measures the pressure of air flow after the air flow has interacted with processor 330 and/or circuit board 320-2. Other pressure sensors 360 (e.g., 360-6, 360-7, 360-8, and 360-9) measure air pressures in other regions of enclosure body 611. As with other embodiments, the plurality of air pressures sensors 360 form a two-dimensional arrangement which can be used to form a map of air pressure measurements for any operating configuration of cooking unit 310.

Figure 7:
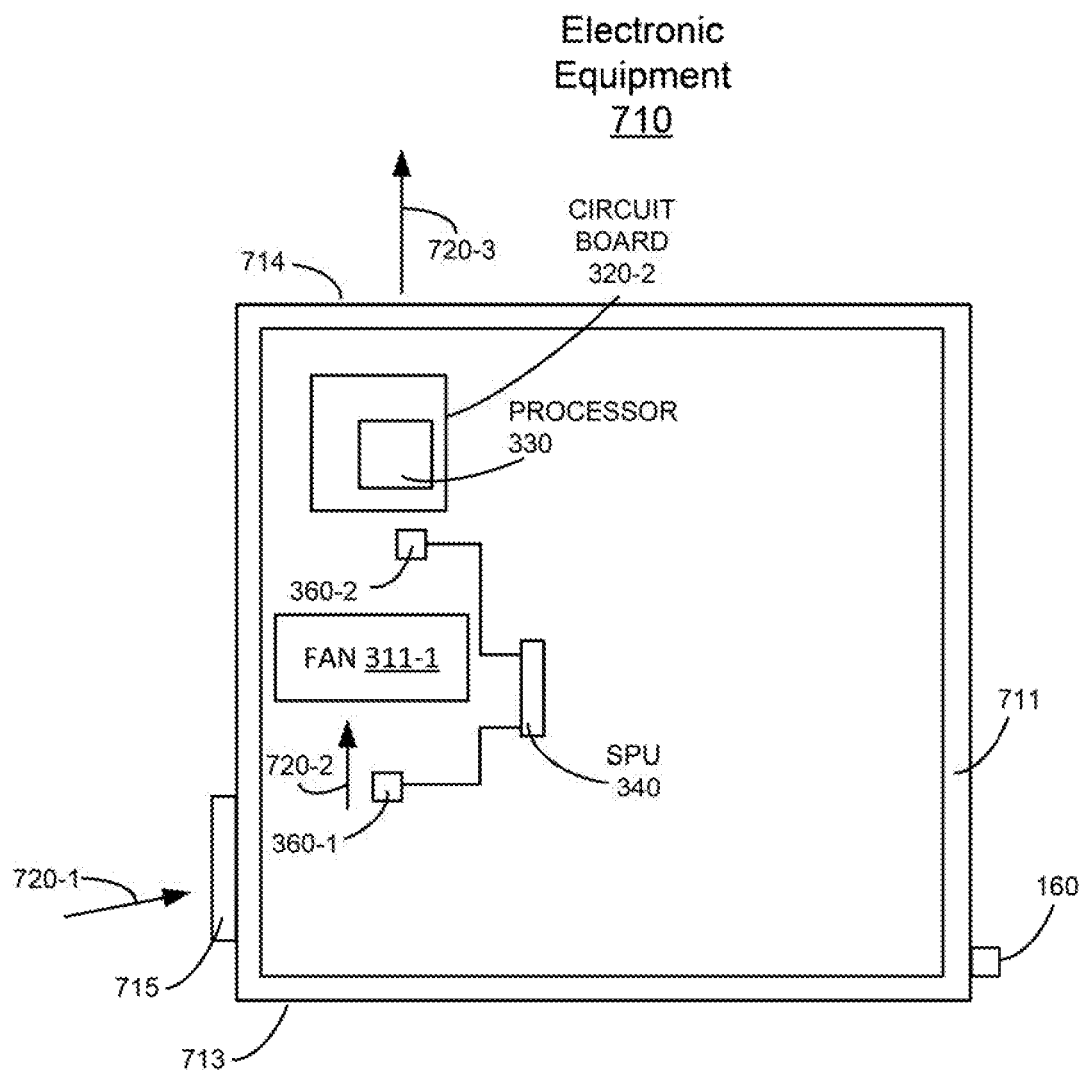
FIG. 7 illustrates a top view block diagram of the inside of an item of electronic equipment, in accordance with various embodiments.

FIG. 7 illustrates a top view block diagram of the inside of an item of electronic equipment 710 (e.g., a rack unit, server computer, laptop computer, notebook computer, tower computer, projector, display, etc.), in accordance with various embodiments. The presented view is a top view of the enclosure body 711. A cover to body 711, if one exists, has removed to illustrate the block diagram of components. Enclosure body 711 has a front 713 and a rear 714 and air flow is pulled and pushed generally in directions 720-1, 720-2, and 720-3 through enclosure body 711. That is, air is pulled in through one or more air intakes 715 on the side(s) (not at front 713 or rear 714), is pushed across cooled components(s), and then exits at rear 714 after flowing across components that are being cooled. FIG. 7 is similar to FIG. 3C in that neither sensor processing unit 340 nor any pressure sensors 360 are disposed as components of circuit board 320-3, however, in other embodiments they may be. Although not depicted, processor 330 may be coupled with a heatsink. Pressure sensor 360-1 is disposed in front (with respect to the general air flow direction 720) of fan 311-1 and measures the pressure of air flow prior to the air flow interacting with fan 311-1. Pressure sensor 360-2 is disposed aft (with respect to general air flow direction 720) of fan 311-1 and measures the pressure of air flow after the air flow has interacted with fan 311-1 and before it interacts with processor 330 and/or circuit board 320-2. Other pressure sensors 360 may be disposed aft of processor 330 and or circuit board 320-2 in the flow of air to measure air pressures after air flow has interacted with processor 330 and/or circuit board 320-2. As with other embodiments, additional pressure sensors 360 may be included to form a two-dimensional arrangement which can be used to form a map of air pressure measurements for any operating configuration of fan 311-1.

Figure 8:
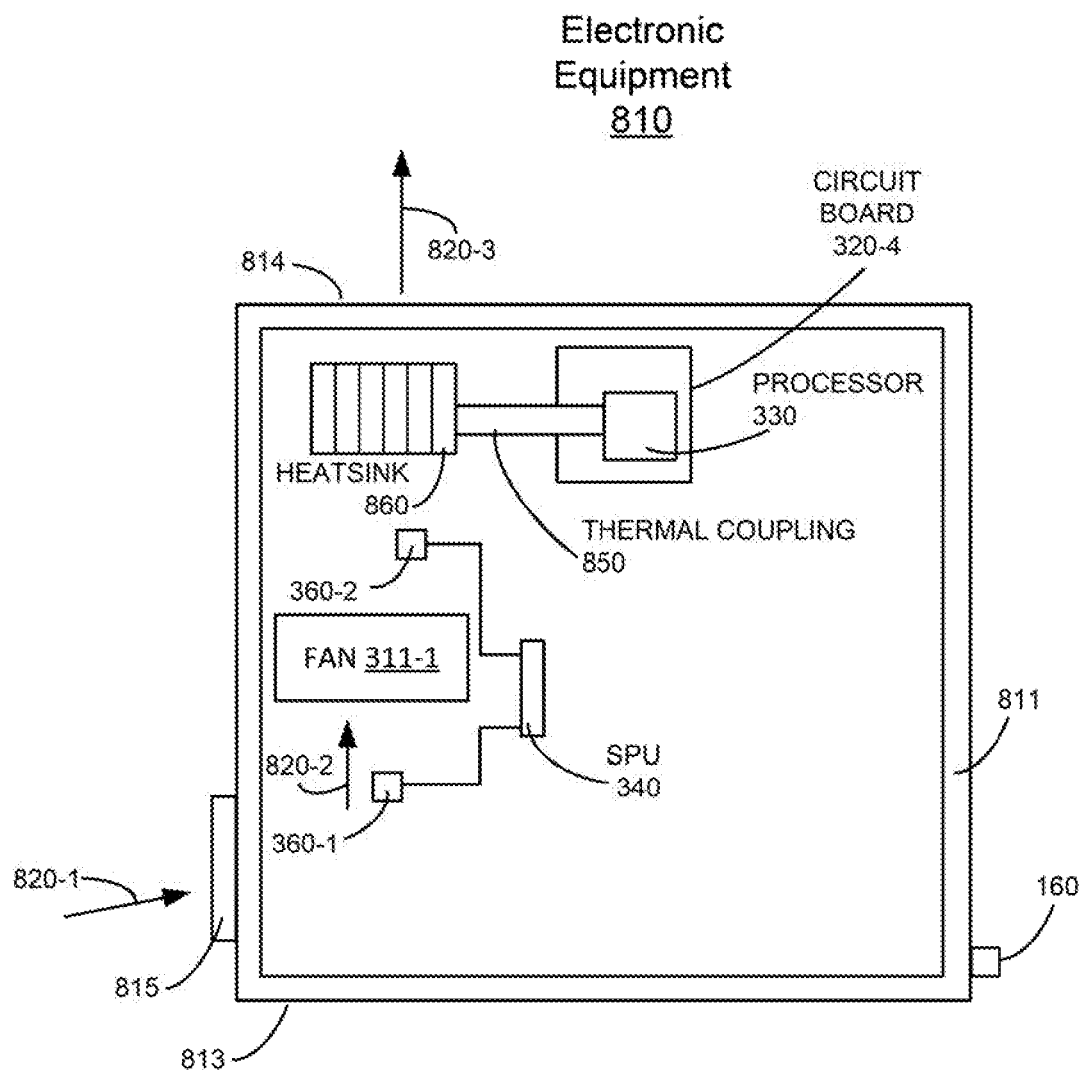
FIG. 8 illustrates a top view block diagram of the inside of an item of electronic equipment, in accordance with various embodiments.

FIG. 8 illustrates a top view block diagram of the inside of an item of electronic equipment 810 (e.g., a rack unit, server computer, laptop computer, notebook computer, tower computer, projector, display, etc.), in accordance with various embodiments. The presented view is a top view of the enclosure body 811. A cover to body 811, if one exists, has removed to illustrate the block diagram of components. Enclosure body 811 has a front 813 and a rear 814 and air flow is pulled and pushed generally in directions 820-1, 820-2, and 820-3 through enclosure body 811. That is, air is pulled in through one or more air intakes 815 on the side(s) (not at front 813 or rear 814), is pushed across cooled components(s), and then exits at rear 814 after flowing across components that are being cooled. FIG. 8 is similar to FIG. 3C in that neither sensor processing unit 340 nor any pressure sensors 360 are disposed as components of circuit board 320-4, however, in other embodiments they may be. Processor 330 is shown with a thermal coupling 850 to a heatsink 860 located a distance away from processor 330. Pressure sensor 360-1 is disposed in front (with respect to general air flow direction 820) of fan 311-1 and measures the pressure of air flow prior to the air flow interacting with fan 311-1. Pressure sensor 360-2 is disposed aft (with respect to general air flow direction 820) of fan 311-1 and measures the pressure of air flow after the air flow has interacted with fan 311-1 and before it interacts with heatsink 860. Other pressure sensors 360 may be disposed aft heatsink 860 and/or fore and aft of processor 330 and/or circuit board 320-4 in the flow of air to measure air pressures. As with other embodiments, additional pressure sensors 360 may be included to form a two-dimensional arrangement which can be used to form a map of air pressure measurements for any operating configuration of fan 311-1.

Figure 9:
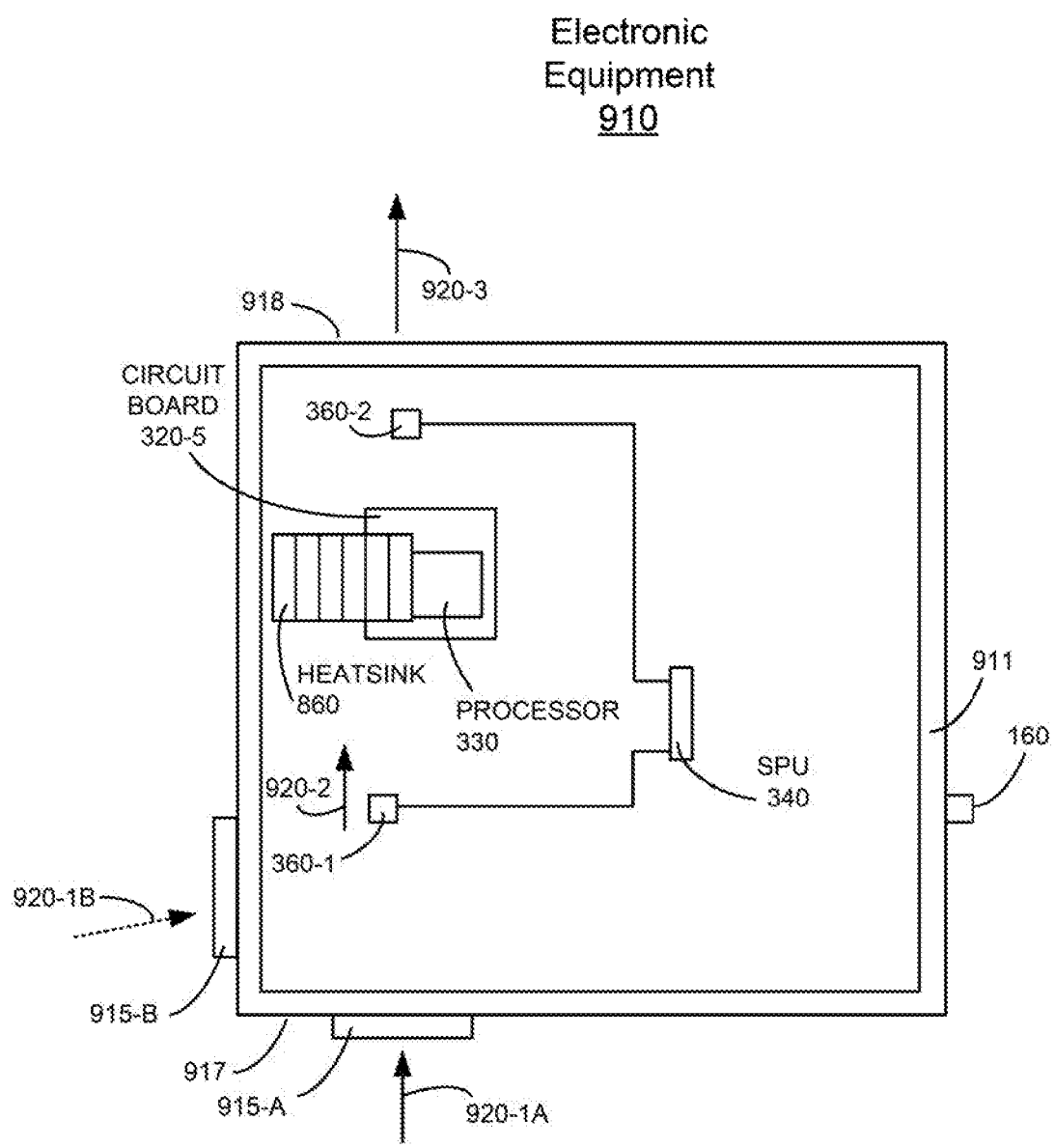
FIG. 9 illustrates a side view block diagram of the inside of an item of electronic equipment, in accordance with various embodiments.

FIG. 9 illustrates a side view block diagram of the inside of an item of electronic equipment 910 (e.g., a rack unit, server computer, laptop computer, notebook computer, tower computer, projector, display, etc.), in accordance with various embodiments. The presented view is a top view of the enclosure body 911. A side cover to body 911, has removed to illustrate the block diagram of components. Enclosure body 911 has a bottom 917 and a top 918 and convection from internally generated heat moves air generally from the bottom 917 to the top 918 in directions 920-1A/920-1B, 920-2, and 920-3 through enclosure body 911. That is, no fan or cooling unit is utilized. Instead, convection from rising heat pulls air in through one or more air intakes 915-A on the bottom or 915-B on the side. The air flow then proceeds across cooled components(s) before exiting at top 918. FIG. 9 is similar to FIG. 3C in that neither sensor processing unit 340 nor any pressure sensors 360 are disposed as components of circuit board 320-5, however, in other embodiments they may be. Processor 330 is shown coupled to a heatsink 860 located on circuit board 320. In other embodiments, heatsink 860 may be located remote from processor 330 and thermally coupled, or not included. Pressure sensor 360-1 is disposed in front (with respect to general air flow direction 920) of heatsink 860, circuit board 320-5 and processor 330, and measures the pressure of air flow prior to the air flow interacting with these components. Pressure sensor 360-2 is disposed aft (with respect to general air flow direction 920) of heatsink 860, circuit board 320-5 and processor 330, and measures the pressure of air flow after the air flow has interacted with these components. Other pressure sensors 360 may be disposed aft heatsink 860 and/or fore and aft of processor 330 and/or circuit board 320-5 in the flow of air to measure air pressures. As with other embodiments, additional pressure sensors 360 may be included to form a two-dimensional arrangement which can be used to form a map of air pressure measurements for any operating configuration of fan 311-1. Because pressure sensors 360 are very sensitive, they can measure a difference in pressure between their locations (one nearer the top 918 and the other nearer the bottom 917) based simply on the difference in altitude between pressure sensors 360-1 and 360-2. For example, in one embodiment, a 2 Pascal difference can be measured between the locations of pressure sensors 360-1 and 360-2. This is significantly above the noise level of about 0.5 Pascal associated with pressure sensors 360 in some embodiments. Thus, when deviation in the reference pressure difference occurs, it can be determined that there is a disruption. The disruption may be internal or external. For example, a user may place electronic equipment in a confined space that blocks one or more air intakes 915 or the air outflow port, a pressure deviation from a reference difference may be noted. In a similar manner, comparisons may be made to a pressure sensor 160, located external to enclosure body 911, and if differences in pressure between internal pressure sensor(s) and the external pressure sensor exceed reference values by a predetermined threshold, an air flow disruption may be determined to exist. In response to determining an air flow disturbance exists, an alarm may be triggered by SPU 340 and/or a message or report may be sent by SPU 340 to a controller or responsible entity.

Figure 10:
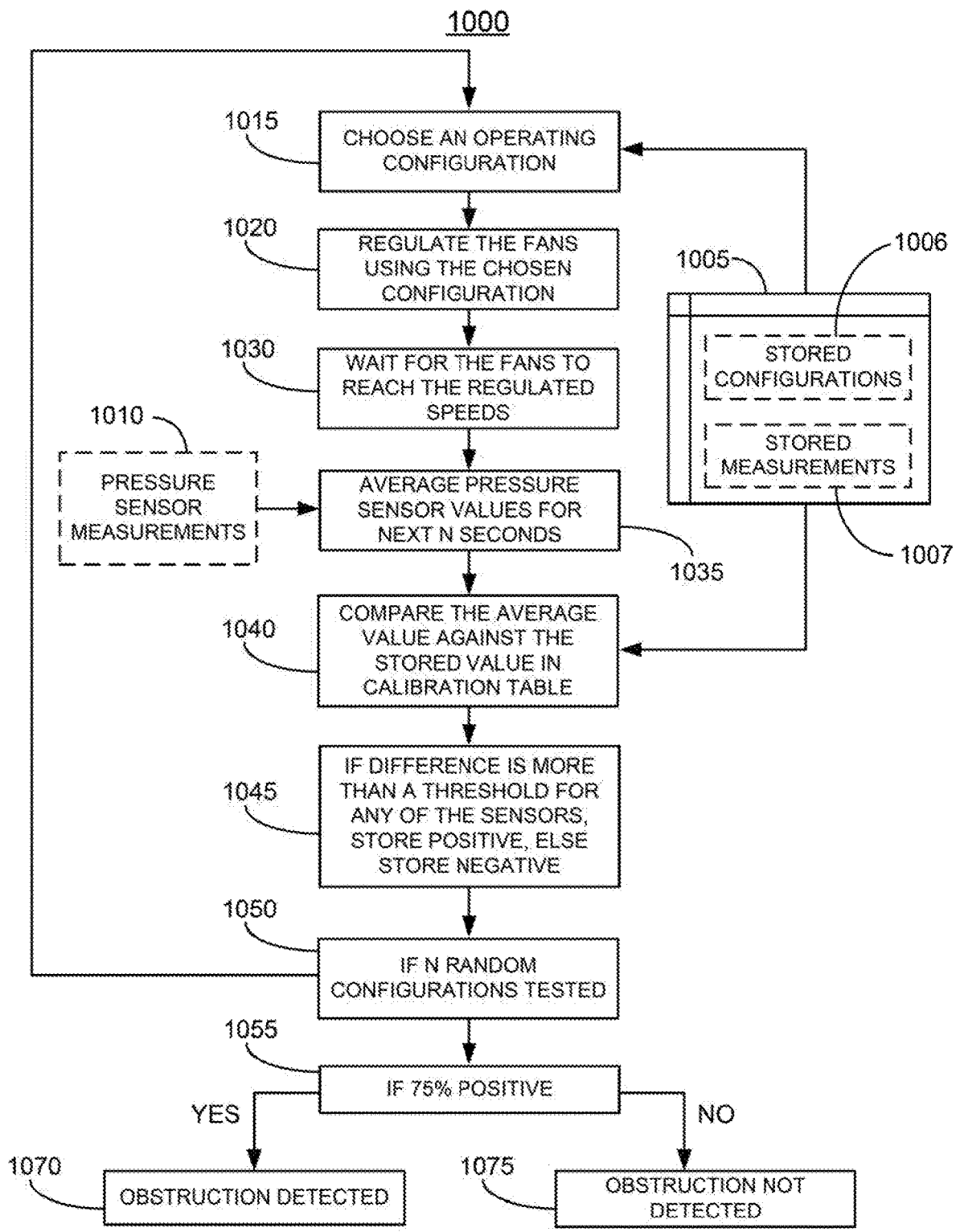
FIG. 10 illustrates a flow diagram of an example method of air flow obstruction detection, in accordance with various embodiments.

FIG. 10 illustrates a flow diagram 1000 of an example method of air flow obstruction detection, in accordance with various embodiments. Procedures of this method will be described with reference to elements and/or components of one or more of FIGS. 1-9. In this embodiment, a plurality of configurations is used in order to improve the accuracy of the obstruction detection, however an obstruction may be similarly detected from the evaluation of a single configuration or from the evaluation of subset of the total number of pressure sensors during a single operating configuration. It is appreciated that in some embodiments, the procedures may be performed in a different order than described, that some of the described procedures may not be performed, and/or that one or more additional procedures to those described may be performed. Flow diagram 1000 includes some procedures that, in various embodiments, are carried out by one or more processors (e.g., sensor processor 581 of sensor processing unit 340) under the control of computer-readable and computer-executable instructions that are stored on non-transitory computer-readable storage media (e.g., memory 586). It is further appreciated that one or more procedures described in flow diagram 1000 may be implemented in hardware, or a combination of hardware with firmware and/or software.

At procedure 1015, an operating configuration of a cooling unit 310 is chosen from a plurality of stored operating configurations 1006 that are stored in a memory 1005. The choice may be predetermined, based on a scheme, random, or effected in some other way. It should be noted that at low fan speed, it may be more difficult to detect obstructions. Therefore, the chosen configuration may be purposely selected to comprise fan speeds above a certain threshold to create a minimum amount of air flow for conducting obstruction detection.

At procedure 1020 the fans 311 of the cooling unit 310 are regulated to the speeds specified in the chose operating configuration.

At procedure 1030 a wait time period is allowed for fans 311 of the cooling unit 310 to reach their regulated speeds and for air flow within a rack unit to stabilize.

At procedure 1035 pressure sensor measurements 1010 from pressure sensors 360 are obtained and the measurements for each particular sensor are averaged over the next N seconds to achieve an average reading for each pressure sensor for the operating configuration. N seconds may be a short period of time such as 5 seconds, or a longer period of time such as 100 seconds or even longer.

At procedure 1040 these average values are compared to stored measurements 1007 that are associated with the operating configuration that has been employed. The stored measurements 1007 may be measurements that were stored as factory defaults, measurements that were empirically determined during previous time periods where cooling unit 310 was operating according to the operating configuration that was chosen in procedure 1015, or some combination (e.g., a running average with starting values supplied as factory defaults).

At procedure 1045, based on the comparison results if a difference of more than a specified threshold for any of the sensors is noted, a positive result is stored. Otherwise a negative result is stored. The threshold value may be a percentage or numerical difference that has been previously stored (such as a default) for the chosen operating configuration or it may be some set difference that is always the same such as a 10% difference.

At procedure 1050 the process proceeds back to procedure 1015 until N random configurations have been tested. N may be 1 operating configuration or some plurality of configurations, such as 2, 3, 10, or 20 operating configurations.

At procedure 1055, if 75% or more of the results are positive then it is determined 1070 that an obstruction to the air flow has been detected. Otherwise, at 1075, it is determined that an obstruction to the air flow has not been detected. In other embodiments, this percentage of positive results needed to detect an obstruction can be set to a different value such as 1%, 25%, 50%, 90% or the like. In some embodiments, the percentage may vary based on the number N of random operating configurations tested. For example, it may be set at 50% when N is 2 operating configurations but set at 75% when N is 4 operating configurations.

In some embodiments, the procedures to detect, locate and quantify possible obstruction may comprise controlling the fans speeds and may therefore interfere with the normal control of the fans speeds depending on the processor load. Therefore, during the obstruction test procedure, the test controller (i.e., SPU 340) may suspend or instruct suspension of normal processing, or may be in control of the processor load, so as to generate the appropriate testing conditions. In some embodiments, these instructions may be communicated to a supervisor, and may have to be approved by the supervisor before any action may be allowed.

Example Method(s) of Operation

FIGS. 11A-11J illustrate a flow diagram 1100 of an example method of air flow disturbance determination, according to various embodiments. Procedures of this method will be described with reference to elements and/or components of one or more of FIGS. 1-10. It is appreciated that in some embodiments, the procedures may be performed in a different order than described, that some of the described procedures may not be performed, and/or that one or more additional procedures to those described may be performed. Flow diagram 1100 includes some procedures that, in various embodiments, are carried out by one or more processors (e.g., sensor processor 581 of sensor processing unit 340) under the control of computer-readable and computer-executable instructions that are stored on non-transitory computer-readable storage media (e.g., memory 586). It is further appreciated that one or more procedures described in flow diagram 1100 may be implemented in hardware, or a combination of hardware with firmware and/or software. Additionally, it should be appreciated that the procedures are being described with respect to circuit boards and servers, however With reference to FIG. 11A, at procedure 1105 of flow diagram 1100, in various embodiments, the air pressure data measured by the plurality of pressure sensors is obtained by sensor processing unit 340. In some embodiments, the plurality of pressure sensors 360 includes, at least, a first pressure sensor and a second pressure sensor. The first pressure sensor (e.g., pressure sensor 360-1) is located between a portion of a circuit board 320 which includes a processor (e.g., processor 330) and a cooling unit 310. The first pressure sensor is configured to measure air pressure data at the location of the first pressure sensor. The second pressure sensor (e.g., pressure sensor 360-2) is located such that the processor (e.g., processor 330) is between the second pressure sensor and the cooling unit 310. The second pressure sensor is configured to measure air pressure data at the location of the second pressure sensor.

With reference to FIG. 11A, at procedure 1110 of flow diagram 1100, in various embodiments, sensor processing unit 340 monitors the air pressure data measured by and obtained from a plurality of pressure sensors 360 disposed within a rack unit 110 or other enclosure for electrical or electromechanical equipment (e.g., circuit boards, hard drives, processors, memory, etc.). The sensor processing unit 340 is communicatively coupled by wireline or wireless connection with each of the plurality of pressure sensors 360. The rack unit 110 or other enclosure includes a circuit board, such as circuit board 320. A processor, such as processor 330 may be disposed upon the circuit board in some embodiments. The rack unit 110 or other enclosure includes a cooling unit, such as cooling unit 310, which includes at least one fan such as fan 311-1 and the like. The fan(s) 311 may be configured via an operating configuration to generate air flow to cool a portion of the circuit board and/or to cool other regions within a housing 210. The cooling unit is configured to operate according to an operating configuration, where the operating configuration specifies which of the fans 311 of the cooling unit operate and at which percentage of their maximum speed that they operate.

With continued reference to FIG. 11A, at procedure 1115 of flow diagram 1100, in various embodiments, the obtained air pressure data is compared to reference air pressure data for the operating configuration of the cooling unit. The comparison may be performed by sensor processing unit 340 which compares the obtained air pressure data for each air pressure sensor 360 to stored (reference) air pressure data for each air pressure sensor. The stored air pressure data may be stored in a memory, such as memory 586 for sensor processing unit 340.

With continued reference to FIG. 11A, at procedure 1120 of flow diagram 1100, in various embodiments, based on the comparison, it is determined that a disturbance to the air flow exists. This determination is made if air pressure data obtained from any pressure sensor varies beyond some predetermined threshold value from the reference value for that pressure sensor and operating configuration.

Figure 11B:
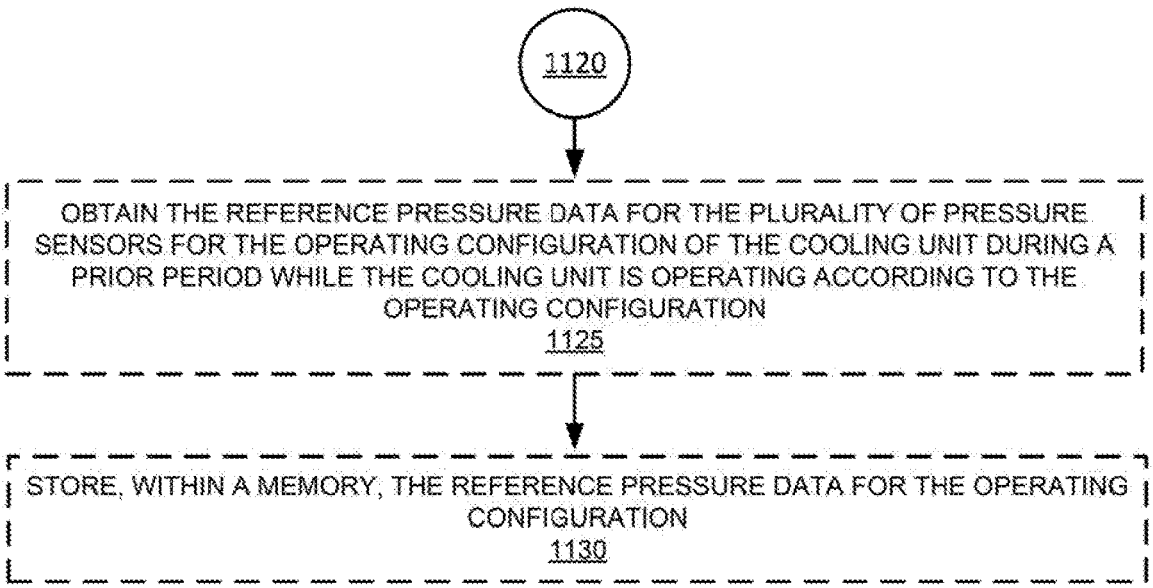

With reference to FIG. 11B, at procedure 1125 of flow diagram 1100, in various embodiments, the method as illustrated in FIG. 11A further includes obtaining the reference air pressure data for the plurality of pressure sensors for the operating configuration of the cooling unit during a prior period (prior to procedures 1105-1120) while the cooling unit is operating according to the operating configuration. The air pressure data may be obtained by sensor processing unit 340 from pressure sensors 360 that are disposed in a rack unit 110 or other enclosure.

With continued reference to FIG. 11B, at procedure 1130 of flow diagram 1100, in various embodiments, the reference air pressure data for the operating configuration is stored within a memory. For example, during the prior period, sensor processing unit 340 stores in memory 586 air pressure data that is obtained from the pressure sensors 360 that are disposed in a rack unit 110 or other enclosure. In various embodiments, the raw air pressure data may be stored as the air pressure data that is obtained, stored as an average value of the air pressure data obtained over some time period, or the obtained air pressure data (either raw or averaged) may be averaged with any existing stored reference air pressure data for the operating configuration.

Figure 11C:
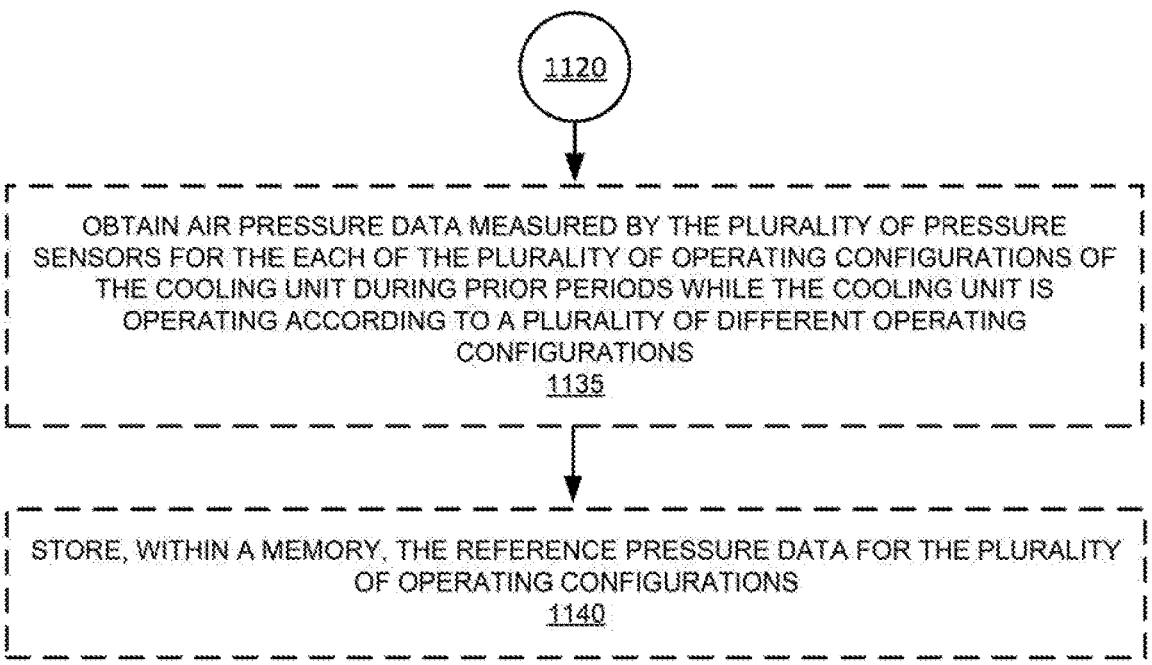

With reference to FIG. 11C, at procedure 1135 of flow diagram 1100, in various embodiments, the method as illustrated in FIG. 11A further obtaining air pressure data measured by the plurality of pressure sensors 360 in a rack unit (or other enclosure) for each of a plurality of operating configurations of the cooling unit 310 of the rack unit 110 (or other enclosure). This is accomplished during a prior period (before procedures 1105-1120) while the cooling unit 310 is operating according to a plurality of different operating configurations. The air pressure data may be obtained by sensor processing unit 340 from pressure sensors 360 that are disposed in a rack unit 110 or other enclosure. The plurality of operating configurations comprises at least: a first configuration where the at least one fan is operated at a first speed; and a second configuration where the at least one fan is operated at a second speed that is different from the first speed. It should be appreciated that there may be many more than two operating configurations.

With continued reference to FIG. 11C, at procedure 1140 of flow diagram 1100, in various embodiments, the method as illustrated in FIG. 11A further includes storing, within a memory, the reference air pressure data for the plurality of operating configurations. For example, during the prior period, sensor processing unit 340 stores in memory 586 air pressure data that is obtained from the pressure sensors 360 that are disposed in a rack unit 110 or other enclosure. This is done for the plurality of operating configurations. In various embodiments, the raw air pressure data may be stored as the air pressure data that is obtained, stored as an average value of the air pressure data obtained over some time period, or the obtained air pressure data (either raw or averaged) may be averaged with any existing stored reference air pressure data for the operating configuration.

Figure 11D:
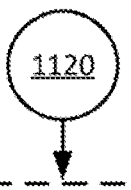

With reference to FIG. 11D, at procedure 1145 of flow diagram 1100, in various embodiments, the method as illustrated in FIG. 11A further includes based on the comparison, determining a location of the disturbance to the air flow. This can comprise sensor processing unit 340 determining the location of the disturbance to the air flow, based on which pressure sensor(s) bust the threshold of difference when their respective obtained pressure measurements are compared to their respective reference pressure measurements. The location may be expressed as the name or number or location of the pressure sensor 360 which exceeded its threshold during the comparison of procedure 1115. The pressure sensors 360 may be linked, such as in a look up table in memory 586, to general descriptions of their locations within housing 210 of rack unit 110 or within the housing of another enclosure for electrical equipment.

Figure 11E:
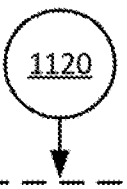

With reference to FIG. 11E, at procedure 1150 of flow diagram 1100, in various embodiments, the method as illustrated in FIG. 11A further includes based on the comparison, determining a region of the circuit board which is experiencing a decrease to the flow of cooling. For example, when pressure sensors 360 are known to be disposed fore and aft of a component or area of a circuit board and one or both demonstrate a change in pressure which exceeds respective threshold values or else a pressure differential between them (when compared to a reference differential) exceeds a predetermined threshold, sensor processing unit 340 identifies that the region of the circuit board between the two pressure sensors is experiencing an obstruction. In some embodiments, this region comprises a portion of the circuit board (e.g., circuit board 320) where a processor (e.g., processor 330) is disposed and which is located between the first pressure sensor and the second pressure sensor that were described in procedure 1105.

Figure 11F:

With reference to FIG. 11F, at procedure 1155 of flow diagram 1100, in various embodiments, the method as illustrated in FIG. 11A further includes generating disturbance data related to the disturbance to the air flow. The disturbance data may come from group of disturbance data that includes: 1) data indicating that a disturbance to the air flow exists; data indicating a location or estimated of the disturbance to the air flow; and 3) data quantifying and/or classifying the disturbance to the air flow. The disturbance data may further include the obtained air pressure data and the reference air pressure data for some or all the pressure sensors 360 for which air pressure data is obtained. The disturbance data may further include differences (between obtained and reference air pressure data) and thresholds for difference associated with determining a disturbance or obstruction exists.

Figure 11G:
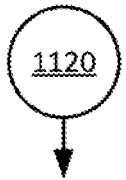

With reference to FIG. 11G, at procedure 1160 of flow diagram 1100, in various embodiments, the method as illustrated in FIG. 11A further includes classifying the disturbance to the air flow as a one of an obstruction and a malfunction of the cooling system based on a difference between the obtained air pressure data and the reference air pressure data. For example, an obstruction may only impact a small subset of air pressure sensors with aberrant measurement comparisons that bust thresholds during comparisons, while a malfunction may be characterized by a wider impact in which comparisons bust thresholds at a higher number of pressure sensors than experienced during a typical obstruction. Additionally, or alternatively, in some embodiments, sensor processing unit 340 may check the operation of each fan 311 in a cooling unit 310 to determine if it is properly operating after determining that there is a disturbance to air flow. If all fans 311 are determined to be operating as expected, then the disturbance to air flow can be attributed to an obstruction.

Figure 11H:
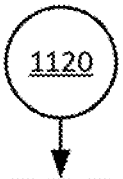

With reference to FIG. 11H, at procedure 1165 of flow diagram 1100, in various embodiments, the method as illustrated in FIG. 11A further includes sending a communication about the disturbance to the air flow. The communication can be sent as an interrupt, report, or other electronic signal from sensor processing unit 340 to an entity such as a processor (e.g., processor 330), a monitoring system, or to a manager or other responsible person. Likewise, sensor processing unit 340 may send or cause to be sent an email, text message, or other electronic alert. The message may simply indicate that there has been a disturbance to air flow or may include additional information such as any of the previously described disturbance information or other information.

Figure 11I:
Figure 11I:

With reference to FIG. 11I, at procedure 1170 of flow diagram 1100, in various embodiments, the method as illustrated in FIG. 11A further includes coordinating modification of the operating configuration of the cooling unit to correct for the disturbance to the air flow.

Detection of an obstruction to air flow may trigger a new calibration routine which runs fans through a series of possible operating configurations of cooling unit 310 in an attempt to achieve the same airflow as before, but now with a different operating configuration that compensates from the problem (e.g., obstruction, modified configuration, and/or fan malfunction). In some embodiments, sensor processing unit 340 initiates and carries out this calibration. If the original air flow (e.g., air pressure measurements within the thresholds when compared to reference air pressure measurements) can be re-achieved with a different operating configuration of cooling unit 310, then a processor such as SPU 340 may coordinate the change in operating configuration to this different operating configuration to correct for the disturbance to air flow that has been determined to exist. In some embodiments, the coordinating may involve setting all the fans 311 in a cooling unit 310 to a different stored operating configuration, iteratively adjusting the fans 311 in a cooling unit 310 to determine an acceptable new operating configuration, and/or defaulting to a safety operating configuration such as setting all fans 311 in a cooling unit 310 to operate at maximum speed. If the problem cannot be corrected because no operating configuration can be found to overcome the problem, sensor processing unit 340 may communicate the problem to a system supervisor, manager, or other person or entity.

Figure 11J:
Figure 11J:

With reference to FIG. 11J, at procedure 1175 of flow diagram 1100, in various embodiments, the method as illustrated in FIG. 11A further includes initiating, by the sensor processing unit, a shutdown to prevent overheating the circuit board. In some embodiments, either as a default or as an action when a new operating configuration cannot be found which resolves a noted disturbance to air flow, sensor processing unit 340 may send a command to processor 330, to a power supply of rack unit 110 (or other enclosure), or elsewhere to initiate a shutdown, throttle down (to reduce the load), or idling of an overall item of electrical equipment (e.g., rack unit 110) or a component thereof such as processor 330. A "shutdown" turns off some or all of the electronic components in the item of electrical equipment (e.g., rack unit 110) but may keep the cooling unit running, a "throttle down" keeps the components in the item of electrical equipment (e.g., rack unit 110) functioning but at a lower load level for which available/achievable air flow for cooling is adequate, and an "idling" keeps power to the item of electrical equipment but reduces the allowed load to a very low level or eliminates it to the extent possible. The shutdown, throttle down, or idling is done to prevent overheating of a circuit board (e.g., circuit board 320), a component thereon (e.g., processor 330), and/or other electronic equipment disposed within rack unit 110.

Conclusion

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed. Rather, the specific features and acts described above are disclosed as example forms of implementing the claims.

Reference throughout this document to "one embodiment," "certain embodiments," "an embodiment," "various embodiments," "some embodiments," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics of any embodiment may be combined in any suitable manner with one or more other features, structures, or characteristics of one or more other embodiments without limitation.

What is claimed is:

1. A circuit board cooling system comprising:
    a circuit board;
    a processor disposed upon the circuit board;
    a cooling unit comprising at least one fan configured to generate air flow to cool a portion of the circuit board, the cooling unit configured to operate according to an operating configuration;
    a plurality of pressure sensors configured to measure air pressure data at their respective locations, the plurality of pressure sensors comprising:
        a first pressure sensor located between the processor and the cooling unit and configured to measure air pressure data at a location of the first pressure sensor; and
        a second pressure sensor located such that the processor is between the second pressure sensor and the cooling unit, the second pressure sensor configured to measure air pressure data at a location of the second pressure sensor; and
    a sensor processing unit coupled with the plurality of pressure sensors and configured to:
        obtain the air pressure data measured by the plurality of pressure sensors;
        compare the obtained air pressure data to reference air pressure data for the operating configuration of the cooling unit;
        based on the comparison, determine that a disturbance to the air flow exists; and
        send a communication about the disturbance to the air flow.

2. The circuit board cooling system of claim 1, wherein the sensor processing unit is further configured to:

during a prior period while the cooling unit is operating according to the operating configuration, obtain the reference air pressure data for the plurality of pressure sensors for the operating configuration of the cooling unit; and
store, within a memory, the reference air pressure data for the operating configuration.

3. The circuit board cooling system of claim 2, wherein the sensor processing unit is further configured to:
during prior periods while the cooling unit is operating according to a plurality of different operating configurations, obtain air pressure data measured by the plurality of pressure sensors for the each of the plurality of operating configurations of the cooling unit, wherein the plurality of operating configurations comprises:
a first configuration where the at least one fan is operated at a first speed; and
a second configuration where the at least one fan is operated at a second speed that is different from the first speed; and
store, within a memory, the reference air pressure data for the plurality of operating configurations.

4. The circuit board cooling system of claim 1, wherein the sensor processing unit is further configured to:
based on the comparison, determine a location of the disturbance to the air flow.

5. The circuit board cooling system of claim 1, wherein the sensor processing unit is further configured to:
based on the comparison, determine a region of the circuit board which is experiencing a decrease to the air flow.

6. The circuit board cooling system of claim 5, wherein the region comprises a portion of the circuit board where the processor is disposed and which is located between the first pressure sensor and the second pressure sensor.

7. The circuit board cooling system of claim 1, wherein the sensor processing unit is further configured to:
generate disturbance data related to the disturbance to the air flow, wherein the disturbance data is selected from the group of disturbance data consisting of: data indicating that a disturbance to the air flow exists; data indicating a location of the disturbance to the air flow; and data classifying the disturbance to the air flow.

8. The circuit board cooling system of claim 1, wherein the sensor processing unit is further configured to:
classify the disturbance to the air flow as a one of an obstruction and a malfunction of the cooling unit based on a difference between the obtained air pressure data and the reference air pressure data.

9. The circuit board cooling system of claim 1, wherein the sensor processing unit is further configured to:
coordinate modification of the operating configuration of the cooling unit to correct for the disturbance to the air flow.

10. The circuit board cooling system of claim 1, wherein at least one of the first pressure sensor and the second pressure sensor is mounted on the circuit board and coupled to the sensor processing unit via conductive traces on the circuit board.

11. A rack unit for a server rack, the rack unit comprising:
a housing;
a circuit board disposed within the housing;
a processor disposed upon the circuit board;
a cooling unit coupled with the housing, the cooling unit comprising at least one fan configured to generate air flow to cool a portion of the circuit board, the cooling unit configured to operate according to an operating configuration;
a plurality of pressure sensors disposed within the housing and configured to measure air pressure data at their respective locations, the plurality of pressure sensors comprising:
a first pressure sensor located between the processor and the cooling unit and configured to measure air pressure data at a location of the first pressure sensor; and
a second pressure sensor located such that the processor is between the second pressure sensor and the cooling unit, the second pressure sensor configured to measure air pressure data at a location of the second pressure sensor; and
a sensor processing unit disposed within the housing and configured to:
obtain the air pressure data measured by the plurality of pressure sensors;
compare the obtained air pressure data to reference air pressure data for the operating configuration of the cooling unit;
based on the comparison, determine that a disturbance to the air flow exists; and
send a communication about the disturbance to the air flow.

12. The rack unit of claim 11, wherein the sensor processing unit is further configured to:
during a prior period while the cooling unit is operating according to the operating configuration, obtain the reference air pressure data for the plurality of pressure sensors for the operating configuration of the cooling unit; and
store, within a memory, the reference air pressure data for the operating configuration.

13. The rack unit of claim 11, wherein the sensor processing unit is further configured to:
based on the comparison, determine a location of the disturbance to the air flow.

14. The rack unit of claim 11, wherein at least one of the plurality of pressure sensors is disposed upon an interior surface of a cover of the housing.

15. A method of rack unit air flow disturbance determination comprising:
monitoring, by a sensor processing unit, air pressure data measured by and obtained from a plurality of pressure sensors disposed within a rack unit, wherein the sensor processing unit is coupled with the plurality of pressure sensors, and wherein the rack unit comprises:
a circuit board; and
a cooling unit comprising at least one fan configured to generate air flow to cool a portion of the circuit board, the cooling unit configured to operate according to an operating configuration;
comparing, by the sensor processing unit, the obtained air pressure data to reference air pressure data for the operating configuration of the cooling unit;
based on the comparison, determining by the sensor processing unit that a disturbance to the air flow exists; and
sending, by the sensor processing unit, a communication about the disturbance to the air flow.

16. The method as recited in claim 15, further comprising:
during a prior period while the cooling unit is operating according to the operating configuration, obtaining by the sensor processing unit the reference air pressure data for the plurality of pressure sensors for the operating configuration of the cooling unit; and storing, within a memory by the sensor processing unit, the reference air pressure data for the operating configuration.

17. The method as recited in claim 15, further comprising: determining, by the sensor processing unit, a location of the disturbance to the air flow based on the comparison of the obtained air pressure data to the reference air pressure data.

18. The method as recited in claim 15, further comprising: coordinating, by the sensor processing unit, modification of the operating configuration of the cooling unit to correct for the disturbance to the air flow.

19. The method as recited in claim 15, further comprising: initiating, by the sensor processing unit, a shutdown to prevent overheating the circuit board.

* * * * *